(12) United States Patent
Matsushima et al.

(10) Patent No.: US 10,749,047 B2
(45) Date of Patent: Aug. 18, 2020

(54) SOLAR CELL ELEMENT AND METHOD FOR MANUFACTURING SOLAR CELL ELEMENT

(71) Applicant: KYOCERA CORPORATION, Kyoto (JP)

(72) Inventors: Norihiko Matsushima, Yasu (JP); Akihiro Mizumoto, Omihachiman (JP); Akira Murao, Moriyama (JP); Junji Aranami, Otsu (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 16/365,527

(22) Filed: Mar. 26, 2019

(65) Prior Publication Data
US 2019/0221682 A1 Jul. 18, 2019

Related U.S. Application Data

(63) Continuation of application No. PCT/JP2017/034492, filed on Sep. 25, 2017.

(51) Int. Cl.
*H01L 31/00* (2006.01)
*H01L 31/0216* (2014.01)
(Continued)

(52) U.S. Cl.
CPC .. *H01L 31/02167* (2013.01); *H01L 31/02363* (2013.01); *H01L 31/022441* (2013.01); *H01L 31/068* (2013.01); *Y02E 10/50* (2013.01)

(58) Field of Classification Search
CPC ............................................... H01L 31/02167
(Continued)

(56) References Cited

U.S. PATENT DOCUMENTS

| 2011/0100448 A1 | 5/2011 | Lee et al. |
| 2011/0100450 A1 | 5/2011 | Lee et al. |
| 2014/0041720 A1 | 2/2014 | Yang et al. |

FOREIGN PATENT DOCUMENTS

| JP | 2004-064028 A | 2/2004 |
| JP | 2010-527146 A | 8/2010 |

(Continued)

OTHER PUBLICATIONS

English machine translation of JP-2013004831-A (Year: 2019).*

*Primary Examiner* — Angelo Trivisonno
(74) *Attorney, Agent, or Firm* — Duane Morris LLP

(57) ABSTRACT

The solar cell element includes a semiconductor substrate with first and second surfaces, a passivation layer located on the second surface, a protective layer located on the passivation layer, and a back-surface electrode located on the protective layer. The back-surface electrode is electrically connected to the semiconductor substrate via one or more hole portions penetrating the protective layer and the passivation layer. The protective layer includes a first region showing a tendency to increase in thickness as a distance from an inner edge portion of the hole portion and a second region surrounding the first region. A distance between a position of the first region farthest from the inner edge portion and the inner edge portion is larger than a thickness in the second region. The back-surface electrode shows a tendency to decrease in thickness on the first region as a distance from the inner edge portion.

7 Claims, 13 Drawing Sheets

(51) Int. Cl.
*H01L 31/0236* (2006.01)
*H01L 31/0224* (2006.01)
*H01L 31/068* (2012.01)

(58) Field of Classification Search
USPC .......................................................... 136/256
See application file for complete search history.

(56) References Cited

FOREIGN PATENT DOCUMENTS

| | | | |
|---|---|---|---|
| JP | 2011-97005 | A | 5/2011 |
| JP | 2011-100973 | A | 5/2011 |
| JP | 2013-4831 | A | 1/2013 |
| JP | 2013004831 | A * | 1/2013 |
| JP | 2014-39018 | A | 2/2014 |
| WO | 2008/137174 | A1 | 11/2008 |
| WO | 2014/126117 | A1 | 8/2014 |

* cited by examiner

III-III

V-V

IX-IX

X-X

F I G. 1 3
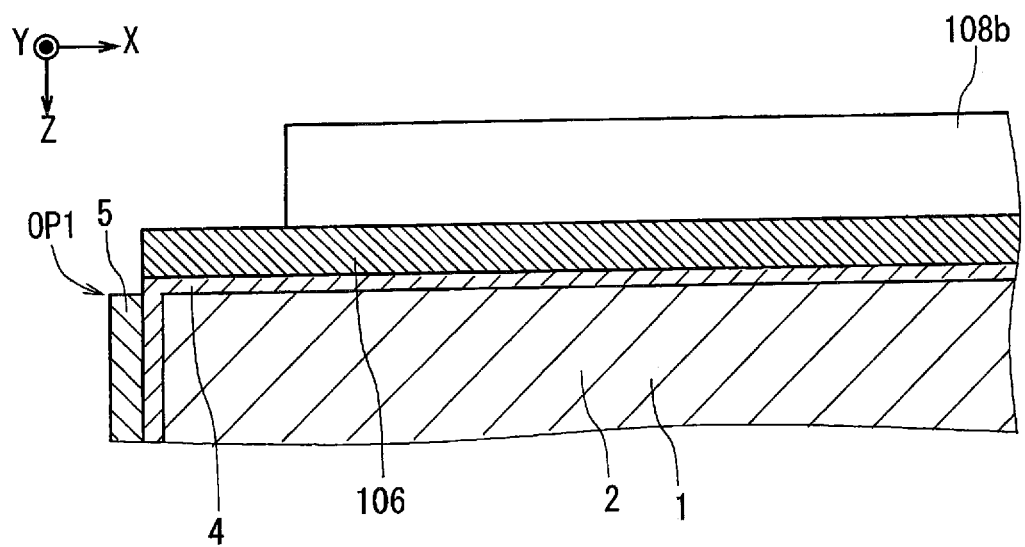

SOLAR CELL ELEMENT AND METHOD FOR MANUFACTURING SOLAR CELL ELEMENT

CROSS-REFERENCE TO RELATED APPLICATIONS

The present application is a continuation based on PCT Application No. PCT/JP2017/034492 filed on Sep. 25, 2017, which claims the benefit of Japanese Application No. 2016-190693, filed on Sep. 29, 2016 and the benefit of Japanese Application No. 2016-204546, filed on Oct. 18, 2016. PCT Application No. PCT/JP2017/034492 is entitled "SOLAR CELL ELEMENT AND METHOD FOR MANUFACTURING SOLAR CELL ELEMENT", Japanese Application No. 2016-190693 is entitled "SOLAR CELL ELEMENT AND METHOD FOR MANUFACTURING SOLAR CELL ELEMENT", and Japanese Application No. 2016-204546 is entitled "SOLAR CELL ELEMENT". The contents of which are incorporated by reference herein in their entirety.

FIELD

The present disclosure relates to a solar cell element and a method for manufacturing a solar cell element.

BACKGROUND

Solar cell elements include PERC (Passivated Emitter and Rear Cell) type solar cell elements. The PERC type solar cell element has a structure in which a passivation layer, a protective layer, and a back-surface electrode are stacked in this order on the back surface of a crystalline silicon substrate. Here, the back-surface electrode is electrically connected with the back surface of the crystalline silicon substrate via a contact hole penetrating the passivation layer and the protective layer.

SUMMARY

A solar cell element and a method for manufacturing a solar cell element are disclosed.

In one aspect, a solar cell element includes a semiconductor substrate, a passivation layer, a protective layer, and a back-surface electrode. The semiconductor substrate has a first surface and a second surface opposite the first surface. The passivation layer is located on the second surface. The protective layer is located on the passivation layer. The back-surface electrode is located on the protective layer. The back-surface electrode is electrically connected to the semiconductor substrate via one or more hole portions penetrating the protective layer and the passivation layer. The protective layer includes a first region showing a tendency to increase in thickness as a distance from an inner edge portion of the hole portion and a second region surrounding the first region. A distance between a position of the first region farthest from the inner edge portion and the inner edge portion is larger than a thickness in the second region. The back-surface electrode shows a tendency to decrease in thickness on the first region as a distance from the inner edge portion.

In one aspect, a method for manufacturing a solar cell element includes preparing a semiconductor substrate, forming a passivation layer, forming a protective layer, and forming a back-surface electrode. The semiconductor substrate has a first surface and a second surface opposite the first surface. Forming the passivation layer includes forming the passivation layer on the second surface. Forming the protective layer includes forming the protective layer by applying a solution so as to form a pattern including a hole portion on the passivation layer and drying the solution. The protective layer includes a thickness variation region that show a tendency to increase in thickness as a distance from the inner edge portion of the hole portion. Forming the back-surface electrode includes forming the back-surface electrode by providing a material for electrode formation on the protective layer and to an inside of the hole portion and heating the material for electrode formation. The back-surface electrode includes an electrode layer located on the protective layer and a connecting portion located so as to penetrate the passivation layer from the inside of the hole portion of the protective layer and electrically connected to the semiconductor substrate.

BRIEF DESCRIPTION OF DRAWINGS

FIG. 13 illustrates a cross-sectional view showing an example of a part of a cross section corresponding to the cut surface of FIG. 10 and FIG. 11 in the solar cell element according to the reference example.

DESCRIPTION OF EMBODIMENTS

Figure 1:
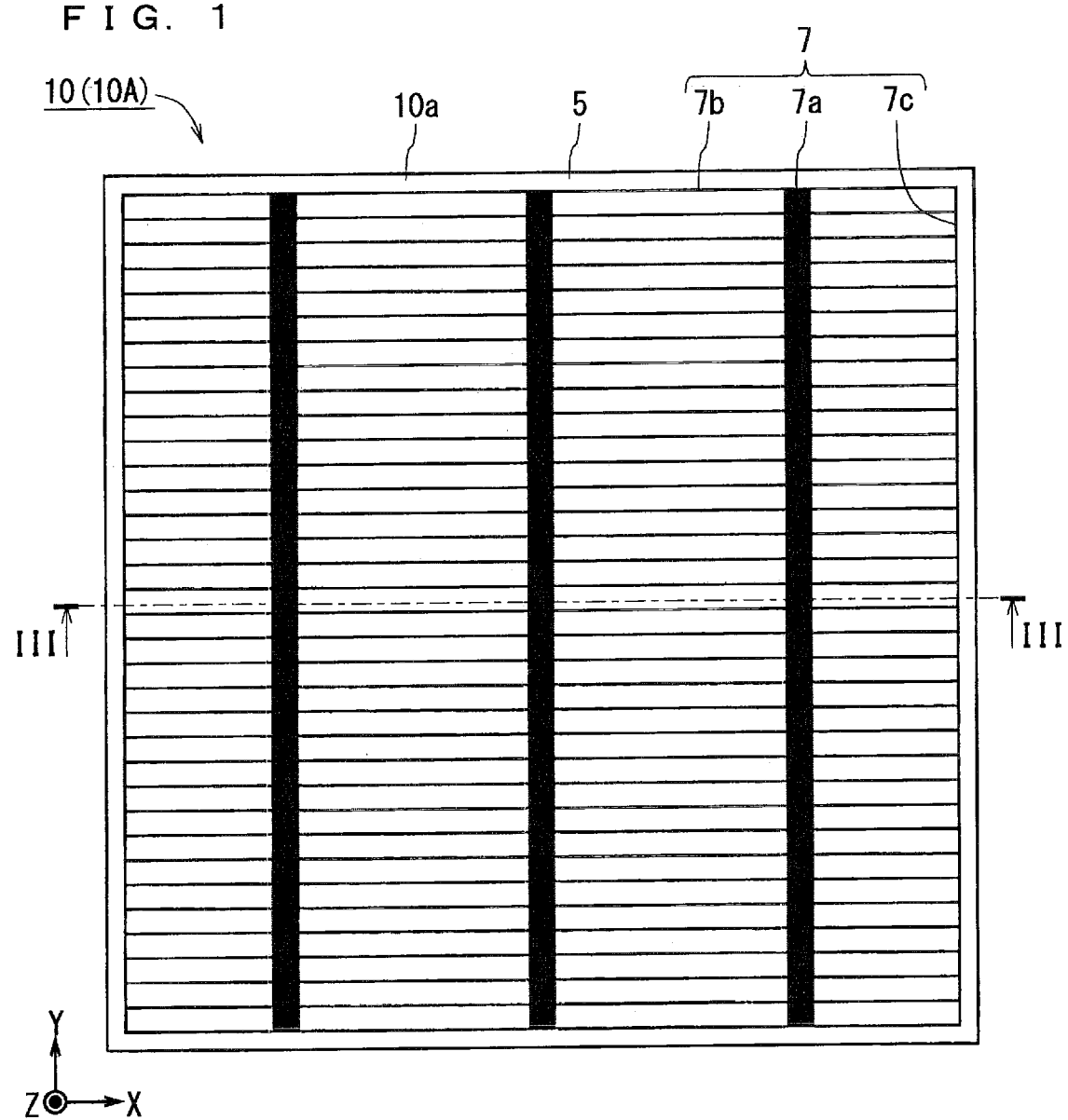
FIG. 1 illustrates a plan view showing an appearance of a first element surface side of an example of a solar cell element according to a first embodiment.

When a PERC type solar cell element is manufactured, for example, a passivation layer, a protective layer, and a back-surface electrode are formed in this order on the back surface of a crystalline silicon substrate. The protective layer is comprised of, for example, an oxide film comprised of silicon oxide or the like, a nitride film comprised of silicon nitride or the like, or a film formed by stacking an oxide film and a nitride film. Here, first, the protective layer is formed by a dry process such as chemical vapor deposition (CVD), plasma-enhanced chemical vapor deposition (PECVD), sputtering, or the like. Next, for example, a hole portion serving as a contact hole is formed in the passivation layer and the protective layer by laser irradiation or the like. Then, for example, at least a part of the back-surface electrode is formed by applying a metal paste containing aluminum as a main component or the like on the protective layer and baking the paste. Here, the main component means a component having the largest (highest) content (also referred to as content ratio) contained in the contained components. At this time, a portion of the passivation layer covered with the protective layer is protected by the protective layer. Further, the back-surface electrode and the back surface of the crystalline silicon substrate are electrically connected via the hole portion.

However, here, for example, when the metal paste is applied onto the protective layer, a region where the thickness of the metal paste sharply changes in the vicinity of the inner edge portion of the hole portion penetrating the passivation layer and the protective layer may occur. In this case, when the metal paste is fired, a remarkable difference easily occurs in the amount of heat shrinkage of the metal paste in the thickness direction in accordance with a sharp change in the thickness of the metal paste. At this time, for example, in the region along the thickness direction from the inner edge portion of the hole portion in the back-surface electrode being fired, there is a risk of a sharp change occurring in the stress in the thickness direction, resulting in generating and developing of cracks. Even after the back-surface electrode is formed, the thermal expansion coefficient may differ approximately by one digit between the oxide film or the nitride film constituting the protective layer and the metal element constituting the back-surface electrode in some cases. For this reason, generation and development of cracks are likely to occur in the region along the thickness direction from the inner edge portion of the hole portion in the back-surface electrode in response to the change in the operating temperature of the solar cell element or the like. Due to the presence of cracks, there is a risk that the electrical resistance of the back-surface electrode increases and the power generation efficiency of the solar cell element decreases.

Therefore, the inventors of the present disclosure created a technology capable of improving the power generation efficiency of the PERC type solar cell element.

Hereinafter, various embodiments will be described with reference to the drawings. In the drawings, the same reference numerals are given to portions having the same configuration and function, and redundant explanations are omitted in the following description. The drawings are shown schematically. In FIG. 1 to FIG. 13, FIG. 16A to FIG. 16F, and FIG. 17, a right-handed XYZ coordinate system is given. In this XYZ coordinate system, the width direction of a hole portion CH1 is the +X direction, the longitudinal direction of the hole portion CH1 is the +Y direction, and the direction orthogonal to both the +X direction and the +Y direction is the +Z direction. In FIG. 2 and FIG. 4, an inner edge portion IE1 of the hole portion CH1 is drawn with a broken line.

1. First Embodiment

<1-1. Schematic Configuration of Solar Cell Element>

A schematic configuration of a solar cell element 10 according to the first embodiment will be described with reference to FIG. 1 to FIG. 3. The solar cell element 10 according to the first embodiment is a PERC type solar cell element.

Figure 2:
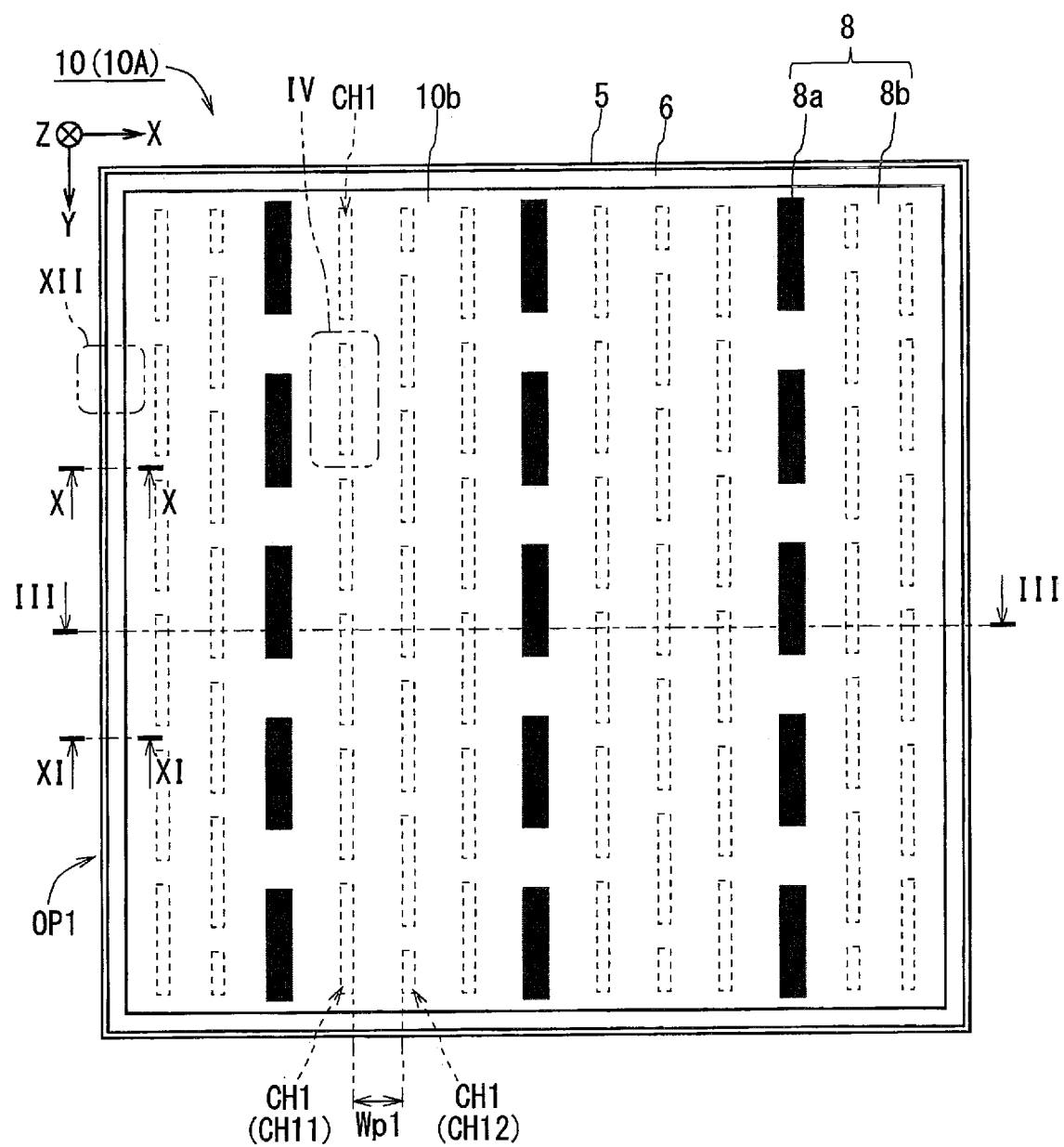
FIG. 2 illustrates a plan view showing an appearance of a second element surface side of an example of the solar cell element according to the first embodiment.
Figure 3:
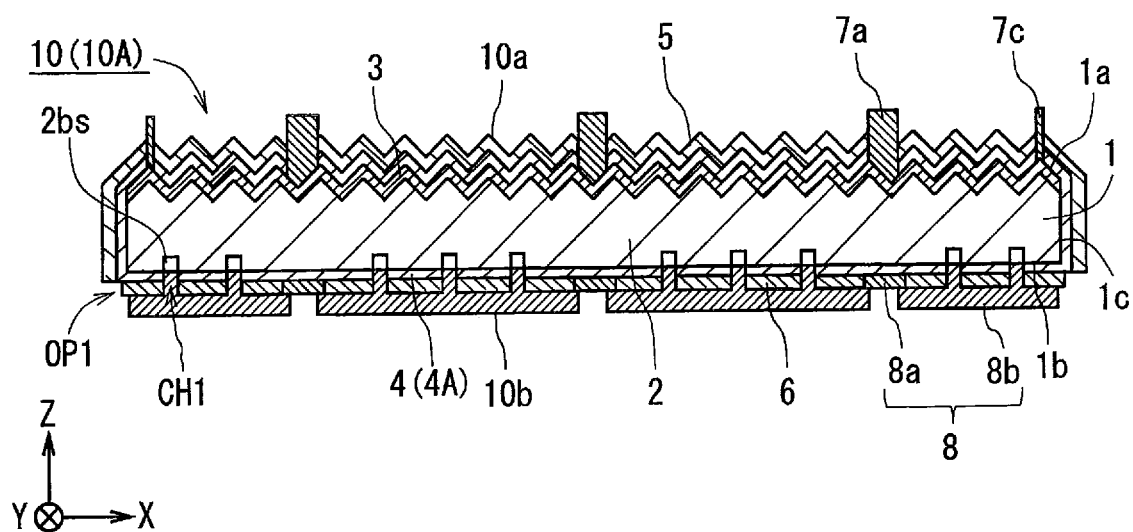
FIG. 3 illustrates a view showing an example of a cross section of the solar cell element taken along the line III-III of FIG. 1 and FIG. 2.
Figure 4:
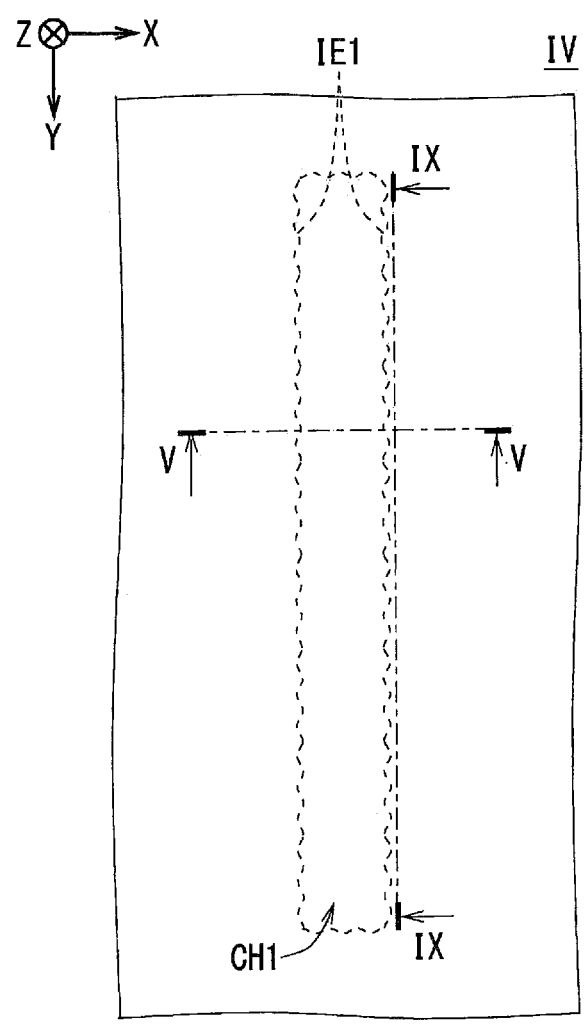
FIG. 4 illustrates an enlarged plan view showing an appearance of an example of the region IV in FIG. 2.

As shown in FIG. 1 to FIG. 3, the solar cell element 10 has a first surface 10a located on the front surface side (also referred to as a first element surface), and a second surface 10b located on the opposite side of the first element surface 10a (also referred to as a second element surface). In the first embodiment, the first element surface 10a faces the +Z direction and the second element surface 10b faces the −Z direction.

The solar cell element 10 includes, for example, a semiconductor substrate 1, a passivation layer 4, an antireflection layer 5, a protective layer 6, a front-surface electrode 7, and a back-surface electrode 8.

The semiconductor substrate 1 has a first surface 1a and a second surface 1b opposite the first surface 1a. The first surface 1a is located on the first element surface 10a side of the solar cell element 10. In the first embodiment, the first surface 1a faces the +Z direction. The second surface 1b is located on the second element surface 10b side of the solar cell element 10. In the first embodiment, the second surface 1b faces the −Z direction. The first surface 1a and the second surface 1b each constitute the board surface of the semiconductor substrate 1 along the XY plane. The semiconductor substrate 1 has a thickness along the +Z direction.

Further, the semiconductor substrate 1 includes a first semiconductor layer 2 and a second semiconductor layer 3. The first semiconductor layer 2 is comprised of a semiconductor having a first conductivity type. The second semiconductor layer 3 is comprised of a semiconductor having a second conductivity type opposite to the first conductivity type. The first semiconductor layer 2 is located at a portion of the semiconductor substrate 1 on the second surface 1b side. The second semiconductor layer 3 is located at a surface layer portion of the semiconductor substrate 1 on the first surface 1a side. In the example of FIG. 3, the second semiconductor layer 3 is located on the first semiconductor layer 2.

Here, for example, it is assumed that the semiconductor substrate 1 is a silicon substrate. In this case, a polycrystalline or monocrystalline silicon substrate is adopted as the silicon substrate. The silicon substrate is, for example, a thin substrate having a thickness of 250 μm or less or 150 μm or less. Further, the silicon substrate has, for example, a substantially rectangular board surface in plan view. When the semiconductor substrate 1 having such a shape is adopted, the gap between the solar cell elements 10 can be reduced when a solar cell module is manufactured by arranging the plurality of solar cell elements 10 side by side.

Further, for example, when the first conductivity type is p-type and the second conductivity type is n-type, the p-type silicon substrate can be produced by, for example, containing impurities such as boron or gallium as dopant elements in a polycrystalline or monocrystalline silicon crystal. In this case, the n-type second semiconductor layer 3 can be generated by diffusing impurities such as phosphorus as a dopant into a surface layer portion of the first surface 1a side of the p-type silicon substrate. At this time, the semiconductor substrate 1 in which the p-type first semiconductor layer 2 and the n-type second semiconductor layer 3 are stacked can be formed. As a result, the semiconductor substrate 1 includes a p-n junction portion located at an interface between the first semiconductor layer 2 and the second semiconductor layer 3.

As shown in FIG. 3, the first surface 1a of the semiconductor substrate 1 may have, for example, a fine rough structure (texture) for reducing the reflection of incoming light. In this case, the height of each protrusion of the texture ranges approximately from 0.1 µm to 10 µm, for example. The distance between apexes of the adjacent protrusions ranges approximately from 0.1 µm to 20 µm, for example. Depressions of the texture may each be approximately spherical, and protrusions of the texture may each be pyramidal, for example. The "height of each protrusion" in FIG. 3, for example, refers to a distance between the apex of the protrusion and a reference line that is defined as a straight line passing through the bottoms of depressions, in a direction perpendicular to the reference line (here, +Z direction).

Furthermore, the semiconductor substrate 1 includes a third semiconductor layer 2bs. The third semiconductor layer 2bs is located on a surface layer portion of the semiconductor substrate 1 on the second surface 1b side. The conductivity type of the third semiconductor layer 2bs is the same as the conductivity type (p-type in the present embodiment) of the first semiconductor layer 2. Concentration of the dopant contained in the third semiconductor layer 2bs is higher than concentration of the dopant contained in the first semiconductor layer 2. The third semiconductor layer 2bs forms an internal electric field on the second surface 1b side of the semiconductor substrate 1. With this, in the vicinity of the second surface 1b of the semiconductor substrate 1, recombination of minority carriers generated by photoelectric conversion in response to irradiation of light in the semiconductor substrate 1 can be reduced. As a result, reduction in photoelectric conversion efficiency hardly occurs. The third semiconductor layer 2bs can be formed by diffusing dopant elements such as aluminum into a surface layer portion of the semiconductor substrate 1 on the second surface 1b side, for example. In this case, concentration of the dopant elements contained in the first semiconductor layer 2 can be set to approximately from $5\times10^{15}$ atoms/cm$^3$ to $1\times10^{17}$ atoms/cm$^3$, and concentration of the dopant elements contained in the third semiconductor layer 2bs is set to approximately from $1\times10^{18}$ atoms/cm$^3$ to $5\times10^{21}$ atoms/cm$^3$. The third semiconductor layer 2bs may be present at a contact portion between a second collecting electrode 8b described later and the semiconductor substrate 1.

The passivation layer 4 is located on at least the second surface 1b of the semiconductor substrate 1. The passivation layer 4 can reduce recombination of minority carriers generated by photoelectric conversion in response to irradiation of light in the semiconductor substrate 1. As a material of the passivation layer 4, for example, one or more kinds selected from an aluminum oxide, a zirconium oxide, a hafnium oxide, a silicon oxide, a silicon nitride, a silicon oxynitride, and the like may be adopted. In this case, the passivation layer 4 can be formed by, for example, atomic layer deposition (ALD). Here, it is assumed that the passivation layer 4 contains the aluminum oxide. In this case, the aluminum oxide has a negative fixed charge. For this reason, minority carriers (electrons in this case) generated on the second surface 1b side of the semiconductor substrate 1 are brought away from an interface between the p-type first semiconductor layer 2 and the passivation layer 4 (second surface 1b) due to an electric field effect. With this, recombination of minority carriers in the vicinity of the second surface 1b of the semiconductor substrate 1 can be reduced. As a result, photoelectric conversion efficiency of the solar cell element 10 can be enhanced. The passivation layer 4 has a thickness of, for example, approximately from 10 nm to 200 nm. The passivation layer 4 may also be located on the first surface 1a of the semiconductor substrate 1, for example. The passivation layer 4 may also be located on an end face 1c connecting the first surface 1a and the second surface 1b of the semiconductor substrate 1, for example.

The passivation layer 4 may contain chlorine, for example. For example, if the passivation layer 4 contains chlorine, a malfunction that the output characteristics of the solar cell element 10 are deteriorated by the PID (Potential Induced Degradation) phenomenon becomes unlikely to occur. The reason for this can be explained as follows. Sodium ion is considered as one of causes of the PID phenomenon. When the sodium ions diffuse into the passivation layer 4, the interface recombination of minority carriers is increased by the decrease in the electric field passivation effect. In addition, when the sodium ions diffuse into the semiconductor substrate 1, recombination of minority carriers further increases. For this reason, the output characteristics of the solar cell element 10 deteriorate. However, when chlorine is contained in the passivation layer 4, the chlorine easily reacts with the sodium ions. As a result, it is presumed that the sodium ions can become hardly diffuse into the passivation layer 4 and the semiconductor substrate 1. The passivation layer 4 containing chlorine can be formed, for example, by introducing a gas containing chlorine in the step of forming the passivation layer 4 by ALD. The concentration of chlorine contained in the passivation layer 4 may be, for example, 1 ppm to 5000 ppm.

The presence and concentration of the chlorine contained in the passivation layer 4 can be measured by, for example, the secondary ion mass spectrometry (SIMS), the ICP-atomic emission spectrometry (ICP-AES), and the like.

The antireflection layer 5 can reduce the reflectance of incoming light to the first element surface 10a of the solar cell element 10. As a material of the antireflection layer 5, for example, a silicon oxide, aluminum oxide, silicon nitride, or the like can be adopted. The refractive index and the thickness of the antireflection layer 5 may be appropriately set to values that allow light out of sunlight within such a wavelength range that is absorbed into the semiconductor substrate 1 and can thus contribute to power generation to satisfy conditions of low reflectance (also referred to as low reflection conditions). For example, it is conceivable that the antireflection layer 5 has a refractive index of approximately from 1.8 to 2.5, and a thickness of approximately from 20 nm to 120 nm.

The protective layer 6 is located on the passivation layer 4 located on the second surface 1b of the semiconductor substrate 1. The protective layer 6 can protect the passivation layer 4. As the material of the protective layer 6, for example, one or more kinds selected from a silicon oxide, a silicon nitride, a silicon oxynitride, and the like are adopted. The protective layer 6 is located in a state of having a desired pattern on the passivation layer 4. The protective layer 6 has a gap penetrating the protective layer 6 in the thickness direction (here, the +Z direction). This gap may be, for example, a hole portion forming a through hole in which the periphery along the second surface 1b is closed or may be a slit-like hole portion in which at least a part of the periphery along the second surface 1b is opened. For example, it is assumed that the protective layer 6 includes the plurality of hole portions CH1 in plan view of the protective layer 6. Here, each of the hole portions CH1 may have a shape of, for example, a dot (point)-like shape, or may be a band-like (linear) shape in plan view of the protective layer 6. The diameter or width of the hole portion CH1 is, for example, approximately from 10 μm to 500 μm. The pitch of the hole portion CH1 is, for example, approximately from 0.3 mm to 3 mm. The pitch of the hole portions CH1 is, for example, the distance between the centers of the hole portions CH1 adjacent to each other in plan view of the protective layer 6.

Meanwhile, when forming the second collecting electrode 8b described later on the protective layer 6, for example, a metal paste (also referred to as Al paste) containing aluminum as a main component is applied so as to have a desired shape, and then fired. At this time, the Al paste applied directly onto the passivation layer 4 through the hole portion CH1 of the protective layer 6 fires through the first passivation layer 4, and hence the second collecting electrode 8b is connected directly to the second surface 1b of the semiconductor substrate 1. At this time, for example, aluminum in the Al paste diffuses into the surface layer portion of the second surface 1b of the semiconductor substrate 1, whereby the third semiconductor layer 2bs is formed.

Also, for example, if the thickness of the protective layer 6 is sufficiently larger than the thickness of the passivation layer 4, the Al paste does not generate fire through of the passivation layer 4 in a portion of the passivation layer 4 covered with the protective layer 6. With this, in the solar cell element 10, the passivation layer 4 can be present in a pattern corresponding to a desired pattern of the protective layer 6 on the second surface 1b of the semiconductor substrate 1.

The thickness of the protective layer 6 is, for example, approximately from 0.5 μm to 10 μm. The thickness of the protective layer 6 is changed appropriately depending on the composition of an insulation paste described later for forming the protective layer 6, the shape of the second surface 1b of the semiconductor substrate 1, the firing conditions at the time of forming the second collecting electrode 8b, and the like.

The protective layer 6 is formed, for example, by applying an insulation paste on the passivation layer 4 formed on the second surface 1b of the semiconductor substrate 1 so as to have a desired pattern by an application such as a screen printing, and then drying it. For example, on the end face 1c of the semiconductor substrate 1, the protective layer 6 may also be formed directly on the end face 1c or also on the antireflection layer 5 formed on the passivation layer 4. In this case, leakage current in the solar cell element 10 can be reduced owing to the presence of the protective layer 6.

Here, for example, the protective layer 6 may contain chlorine. For example, the protective layer 6 may contain chlorine in the form of hydrochloric acid (HCl), chloride, or the like. As the chloride, conceivable examples include zinc chloride ($ZnCl_2$), magnesium chloride ($MgCl_2$), and tin chloride ($SnCl_2$). For example, if the protective layer 6 contains chlorine, in the region containing the low molecular component of the siloxane resin remaining in the protective layer 6, the reaction of hydrolysis and condensation polymerization occurs and thus the siloxane resin is prone to become a polymeric component.

Here, for example, in a case where hydrochloric acid is contained in the protective layer 6, it is assumed that the following reaction occurs. In this case, for example, in the protective layer 6, there is a portion where the terminal portion of the siloxane resin is terminated by a methoxy group ($—OCH_3$), and if moisture and hydrochloric acid are present, the concentration of hydrogen ions becomes high. At this time, for example, hydrogen ions bind to the oxygen at the terminal portion terminated by the methoxy group of the siloxane resin, so that the methyl group in the terminal portion is disconnected from the oxygen, and the silicon present at the terminal portion of the siloxane resin is terminated by a hydroxy group (—OH). At this time, for example, methanol is generated by the bonding of the hydroxide ions and the methyl group disconnected from the terminal portion of the siloxane resin. In this way, the hydrolysis of the siloxane resin is accelerated.

Further, for example, hydrogen ions ($H^+$) derived from hydrochloric acid (HCl) bind to oxygen (O) of a silanol bond (Si—OH bond) at the terminal portion of a first siloxane resin. At this time, chlorine ions ($Cl^-$) derived from hydrochloric acid (HCl) are present. At this time, in the silanol bond portion of the terminal portion of the first siloxane resin, the oxygen to which the hydrogen ion is bonded deprives the electrons of the silicon, and the bond between the silicon and oxygen is disconnected, thereby generating water ($H_2O$). Here, silicon ($Si^+$) deprived of one electron is unstable and tries to bind with surrounding molecules. On the other hand, in the terminal portion of the second siloxane resin, hydrogen (H) of the silanol bond becomes hydrogen ions ($H^+$) and are disconnected from the terminal portion of the second siloxane resin, and Si—$O^-$ in which oxygen is bonded to silicon is generated. At this time, the hydrogen ions ($H^+$) disconnected from the silanol bonds bind with chlorine ions ($Cl^-$), thereby generating hydrochloric acid (HCl). Silicon ($Si^+$) at the terminal portion of the first siloxane resin and Si—$O^-$ at the terminal portion of the second siloxane resin are bonded with each other, thereby generating a siloxane bond (Si—O—Si bond). By such a reaction, the condensation polymerization of the siloxane resin is accelerated. Therefore, for example, in the protective layer 6, the low molecular component of the siloxane resin tends to be the high molecular component of the siloxane resin. As a result, the low molecular component of the siloxane resin is less likely to remain, and volatilization of the low molecular component in the protective layer 6 hardly occurs. Therefore, generation of a void due to volatilization of the low molecular component remaining in the protective layer 6 is reduced, and the moisture permeability of the protective layer 6 tends to be lowered.

Here, for example, in the protective layer 6, there is a portion where the terminal portion of the siloxane resin is terminated by a silanol bond, and in the case where zinc chloride ($ZnCl_2$) as a chloride is contained in the protective layer 6, occurrence of the following reaction is assumed. In this case, for example, two chlorine element portions of zinc chloride ($ZnCl_2$) become two chloride ions ($2Cl^-$) and a portion of zinc element (Zn) becomes zinc ion ($Zn^{2+}$). At this time, the zinc ion ($Zn^{2+}$) is unstable. Therefore, the zinc ion ($Zn^{2+}$) binds with the hydroxyl group of the silanol bond in the first siloxane resin. At this time, silicon ($Si^+$) as a terminal portion of the first siloxane resin, monovalent zinc hydroxide ($ZnOH^+$), and two chlorine ions ($2Cl^-$) are generated. Next, hydrogen ions ($H^+$) are disconnected from unstable monovalent zinc hydroxide ($ZnOH^+$), and zinc oxide (ZnO) is generated. At this time, the hydrogen ion ($H^+$) and two chlorine ions ($Cl^-$) function as catalysts, and the silanol bond in the second siloxane resin and the silicon (Si$^+$) as the terminal portion of the first siloxane resin react. Due to this, a siloxane bond (Si—O—Si bond), zinc oxide (ZnO), two hydrogen ions (2H$^+$), and two chloride ions (2Cl$^-$) are generated. At this time, if hydrogen ions (H$^+$) are present in excess, some of two hydrogen ions (2H$^+$) and two chlorine ions (2Cl$^-$) react appropriately to generate hydrochloric acid (HCl). By such a reaction, the condensation polymerization of the siloxane resin is accelerated. Therefore, for example, in the protective layer 6, the low molecular component of the siloxane resin tends to be a polymeric component of the siloxane resin. As a result, the low molecular component of the siloxane resin is less likely to remain, and volatilization of the low molecular component in the protective layer 6 hardly occurs. Therefore, generation of a void due to volatilization of the low molecular component remaining in the protective layer 6 is reduced, and the moisture permeability of the protective layer 6 tends to be lowered.

In addition, here, for example, by accelerating the condensation polymerization of the siloxane resin, the polymeric component of the siloxane resin and the low molecular component of the siloxane resin, which are positioned at intervals from each other, tend to be the polymeric components of a series of siloxane resins. At this time, the protective layer 6 becomes a dense layer, and the moisture permeability of the protective layer 6 tends to decrease. In addition, the protective layer 6 is hard to be fired through. Thus, the passivation layer 4 can be adequately protected by the protective layer 6, and the passivation effect of the passivation layer 4 hardly deteriorates. Also, when the protective layer 6 contains chlorine, this chlorine easily reacts with sodium ions. For this reason, sodium ions which may cause the PID phenomenon are less likely to diffuse into the passivation layer 4 and the semiconductor substrate 1. As a result, the PID phenomenon also hardly occurs. Therefore, for example, the protective layer 6 contains chlorine, thereby allowing the output characteristics of the solar cell element 10 to be maintained.

Here, the concentration of chlorine contained in the protective layer 6 may be, for example, 1 ppm to 10000 ppm. In this case, the above-described effect can be obtained. The presence and concentration of chlorine contained in the protective layer 6 can be measured by, for example, the SIMS or the ICP-AES.

In the protective layer 6, for example, the content of chlorine in a portion located on the back-surface electrode 8 side may be larger than the content of chlorine in a portion located on the passivation layer 4 side. Thus, for example, if the concentration of chlorine in the protective layer 6 is higher at the portion on the back-surface electrode 8 side than at the portion on the passivation layer 4 side, the polymeric component of the siloxane resin tends to increase at the portion on the back-surface electrode 8 side of the protective layer 6. At this time, voids are unlikely to be generated in the portion of the back-surface electrode 8 side of the protective layer 6. Due to this, the output characteristics of the solar cell element 10 can be maintained.

The front-surface electrode 7 is located on the first surface 1a side of the semiconductor substrate 1. As shown in FIG. 1 and FIG. 3, the front-surface electrode 7 includes a first extracting electrode 7a and a plurality of linear first collecting electrodes 7b.

The first extracting electrode 7a is for extracting the carrier obtained by the photoelectric conversion in response to the irradiation of light in the semiconductor substrate 1 to the outside of the solar cell element 10. As the first extracting electrode 7a, for example, a bus bar electrode having an elongated rectangular shape is adopted in plan view of the first element surface 10a. The length (also referred to as the width) in the short direction of the first extracting electrode 7a is, for example, approximately from 1.3 mm to 2.5 mm. At least a part of the first extracting electrode 7a is in a state of crossing and being electrically connected with the first collecting electrode 7b.

The first collecting electrode 7b can collect carriers obtained by photoelectric conversion in response to the irradiation of light in the semiconductor substrate 1. Each of the first collecting electrodes 7b is, for example, a linear electrode having a width of approximately from 50 μm to 200 μm. In other words, the width of each of the first collecting electrodes 7b is smaller than the width of the first extracting electrode 7a. The plurality of first collecting electrodes 7b are located at intervals of approximately from 1 mm to 3 mm to each other, for example.

The thickness of the front-surface electrode 7 is, for example, approximately from 10 μm to 40 μm. The front-surface electrode 7 can be formed, for example, by applying a metal paste containing silver as a main component in a desired shape by screen printing or the like and then firing this metal paste. Further, for example, an auxiliary electrode 7c having the same shape as that of the first collecting electrode 7b may be positioned along the peripheral edge portion of the semiconductor substrate 1 so that the first collecting electrodes 7b are electrically connected to each other.

The back-surface electrode 8 is located on the second surface 1b side of the semiconductor substrate 1. As shown in FIG. 2 and FIG. 3, the back-surface electrode 8 includes a second extracting electrode 8a and the second collecting electrode 8b.

The second extracting electrode 8a is located on the second surface 1b side of the semiconductor substrate 1. The second extracting electrode 8a is an electrode for extracting the carrier obtained by photoelectric conversion in the solar cell element 10 to the outside of the solar cell element 10. The thickness of the second extracting electrode 8a is, for example, approximately from 10 μm to 30 μm. The width of the second extracting electrode 8a is, for example, approximately from 1.3 mm to 7 mm. In the case where the second extracting electrode 8a contains silver as a main component, the second extracting electrode 8a is formed, for example, by applying a metal paste (also referred to as a silver paste) containing silver as a main component in a desired shape by screen printing or the like, and then by firing.

The second collecting electrode 8b is located on the protective layer 6 on the second surface 1b side of the semiconductor substrate 1. The second collecting electrode 8b is in a state of being electrically connected to the semiconductor substrate 1 via the hole portion CH1 penetrating the protective layer 6 and the passivation layer 4. In the example of FIG. 2, 64 of the hole portions CH1 are present. However, the combination of the size, shape, and number of the hole portions CH1 can be appropriately adjusted. Therefore, the number of hole portions CH1 is, for example, one or more.

The second collecting electrode 8b can collect carriers obtained by photoelectric conversion in response to the irradiation of light in the semiconductor substrate 1 on the second surface 1b side of the semiconductor substrate 1. The second collecting electrode 8b is positioned in a state of being electrically connected to at least a part of the second extracting electrode 8a. The thickness of the second collecting electrode 8b is, for example, approximately from 15 μm to 50 μm. In the case where the second collecting electrode 8b contains aluminum as a main component, the second collecting electrode 8b can be formed by firing after the Al paste is applied in a desired shape, for example.

Further, the second collecting electrode 8b may be located, for example, in a state of having a shape similar to that of the first collecting electrode 7b on the second surface 1b of the solar cell element 10 and being connected with the second extracting electrode 8a. If such a structure is adopted, incoming light onto the second element surface 10b of the solar cell element 10 can also be used for photoelectric conversion in the solar cell element 10. With this, for example, the output in the solar cell element 10 can be improved. Incoming light onto the second element surface 10b may be generated, for example, by reflection of sunlight from the ground or the like.

1-2. Configuration in Vicinity of Hole Portion of Solar Cell Element

A schematic configuration of the vicinity of the hole portion CH1 of the solar cell element 10 according to the first embodiment will be described with reference to FIG. 4 to FIG. 9. Here, the planar shape of the hole portion CH1 penetrating the protective layer 6 can be observed with, for example, an optical microscope or a scanning electron microscope (SEM) after the back-surface electrode 8 of the solar cell element 10 is removed by etching using hydrochloric acid or the like. The cross section of the solar cell element 10 can be observed by SEM or the like after a portion having distortion and scratches due to cutting is removed by etching using hydrochloric acid or the like after cutting of the solar cell element 10, for example.

Figure 5:
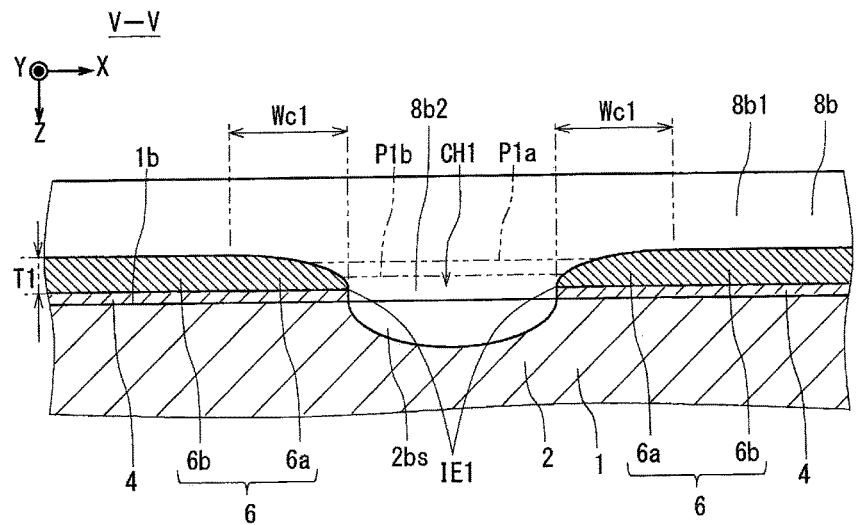
FIG. 5 illustrates a cross-sectional view showing an example of a part of a cross section of the solar cell element taken along the line V-V of FIG. 4.

As shown in FIG. 4 and FIG. 5, the protective layer 6 includes a first region 6a and a second region 6b.

The first region 6a is a region showing a tendency to increase in thickness as a distance from the inner edge portion IE1 of the hole portion CH1 (also referred to as a thickness change region). In other words, the thickness of the protective layer 6 gradually increases from the inner edge portion IE1 of the hole portion CH1 to a portion around the hole portion CH1 in the first region 6a. In this case, for example, the shape of the surface of the first region 6a located on the second collecting electrode 8b side is, for example, a curved shape having few corner portions and projecting to the second collecting electrode 8b side. Here, the tendency to increase in thickness as a distance from the inner edge portion IE1 of the hole portion CH1 includes, for example, not only that the thickness monotonically increases as a distance from the inner edge portion IE1 of the hole portion CH1 increases but also that the thickness increases in a certain extent of region as a distance from the inner edge portion IE1 of the hole portion CH1 increases while the thickness locally increases and decreases somewhat. In other words, the thickness of the first region 6a may monotonically increase as a distance from the inner edge portion IE1 of the hole portion CH1 increases, for example, or may have a tendency to increase as a whole while somewhat increasing and decreasing as a distance from the inner edge portion IE1 of the hole portion CH1. In the example of FIG. 5, the thickness of the protective layer 6 shows a tendency to increase as a distance from the inner edge portion IE1 of the hole portion CH1 in the +X direction or the −X direction.

The second region 6b is located so as to surround the first region 6a. The surface on the −Z side of the second region 6b may be located along the second surface 1b of the semiconductor substrate 1. In this case, for example, if the second surface 1b is a substantially flat surface along the XY plane, the surface on the −Z side of the second region 6b is a surface along the XY plane. In this case, the second region 6b has a substantially constant thickness T1. The surface on the −Z side of the second region 6b may be located not along the second surface 1b of the semiconductor substrate 1. For example, if the second surface 1b has roughness, the surface on the −Z side of the second region 6b may be a substantially flat surface along the XY plane. In such a form, for example, the thickness of the second region 6b may be changed with respect to the shape of the second surface 1b of the semiconductor substrate 1. Therefore, the thickness T1 may be, for example, an average of the thickness of the second region 6b, and may be equal to or greater than the thickness of the first region 6a. The thickness T1 is, for example, approximately from 0.5 μm to 10 μm. The thickness T1 may have a tendency to be substantially constant as a whole while somewhat increasing or decreasing locally. Here, for example, a distance (also referred to as a first distance) Wc1 between a position farthest from the inner edge portion IE1 of the first region 6a and the inner edge portion IE1 is larger than the thickness T1 of the second region 6b.

As shown in FIG. 4 and FIG. 5, the second collecting electrode 8b shows a tendency to decrease in thickness on the first region 6a as a distance from the inner edge portion IE1. In other words, the thickness of the second collecting electrode 8b gradually decreases from the inner edge portion IE1 of the hole portion CH1 to the periphery of the hole portion CH1. Here, the tendency to decrease in thickness as a distance from the inner edge portion IE1 includes, for example, not only that the thickness monotonically decreases as a distance from the inner edge portion IE1 increases but also that the thickness decreases in a certain extent of region as a distance from the inner edge portion IE1 of the hole portion CH1 increases while the thickness locally increases and decreases somewhat. In other words, the thickness of the second collecting electrode 8b may monotonically decrease as a distance from the inner edge portion IE1 of the hole portion CH1 increases, for example, or may have a tendency to decrease as a whole while somewhat increasing and decreasing as a distance from the inner edge portion IE1 of the hole portion CH1.

In the example of FIG. 5, the surface of the −Z side of the second collecting electrode 8b is located along the second surface 1b of the semiconductor substrate 1. In other words, the surface of the −Z side of the second collecting electrode 8b is along the XY plane. The second collecting electrode 8b includes an electrode layer 8b1 and a connecting portion 8b2. The electrode layer 8b1 is a portion located on the protective layer 6. The connecting portion 8b2 is a portion that is located so as to penetrate the passivation layer 4 from the hole portion CH1 of the protective layer 6 and is electrically connected to the semiconductor substrate 1.

Figure 6:
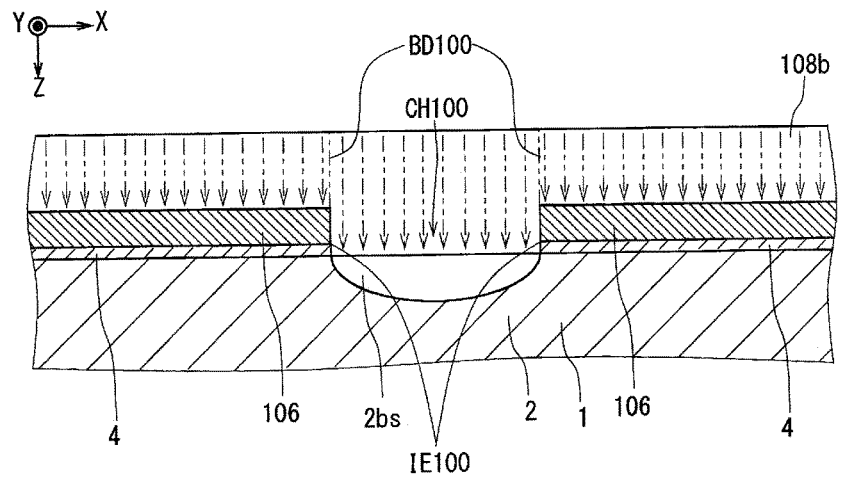
FIG. 6 illustrates a cross-sectional view showing a stress distribution generated in a back-surface electrode according to the reference example.
Figure 7:
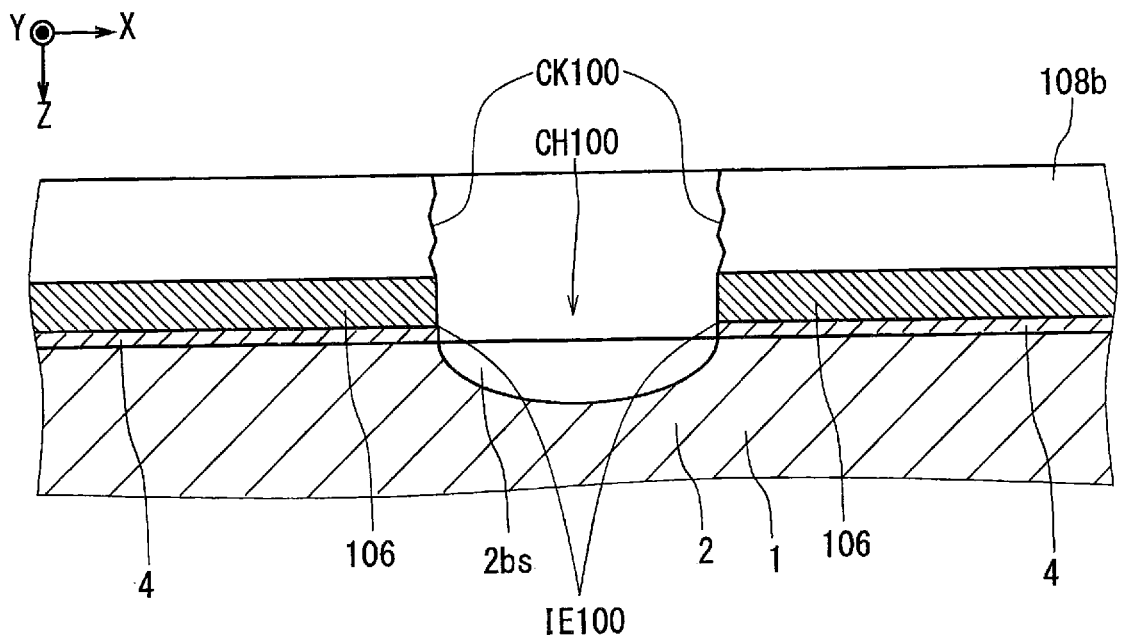
FIG. 7 illustrates a cross-sectional view showing an example of generation of cracks in the back-surface electrode according to the reference example.
Figure 8:
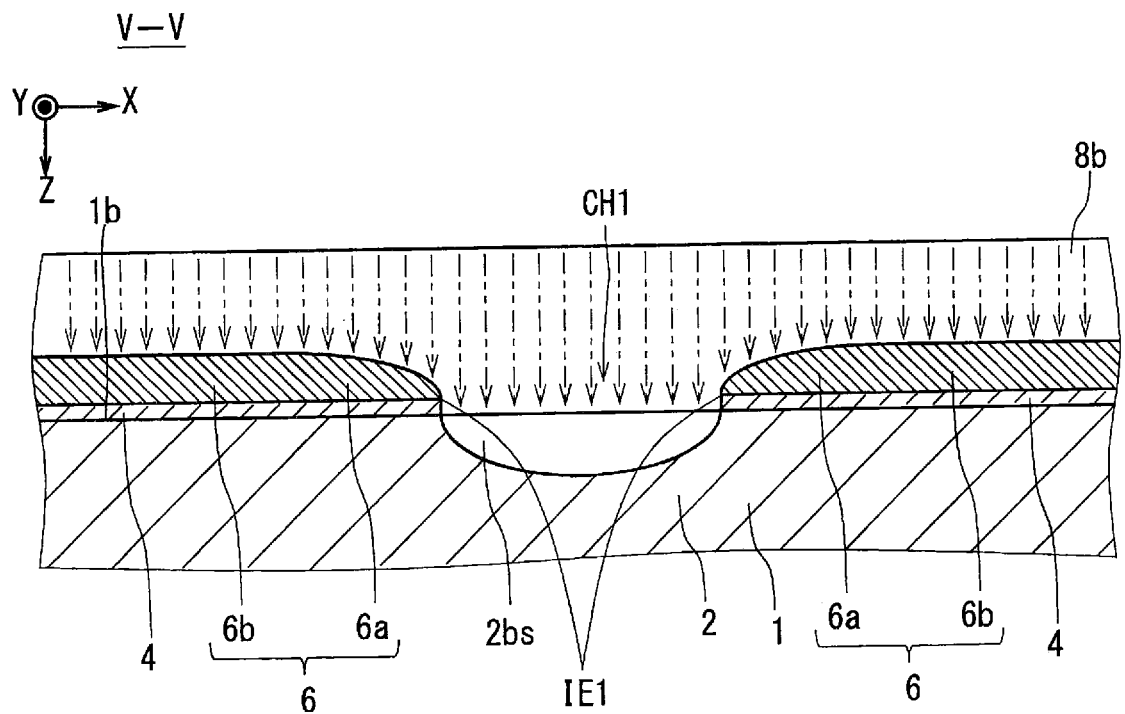
FIG. 8 illustrates a cross-sectional view showing a stress distribution generated in the back-surface electrode around the hole portion.

By the way, as shown in FIG. 6, it is assumed that a protective layer 106 having a substantially constant thickness is formed by a dry process such as CVD, plasma CVD, or sputtering. In this case, for example, when the Al paste is applied on the protective layer 106 by screen printing or the like, the thickness of the Al paste is sharply changing in the vicinity of an inner edge portion IE100 of a hole portion CH100 penetrating the passivation layer 4 and the protective layer 106. In this state, when the Al paste is fired, a remarkable difference may occur in the amount of heat shrinkage of the Al paste in the thickness direction (here, the +Z direction) in accordance with the sharp change in the thickness of the Al paste. At this time, for example, the stress in the thickness direction occurring in a second collecting electrode 108b during firing changes largely in the vicinity of the inner edge portion IE100 of the hole portion CH100. In FIG. 6, the magnitude of the stress in the thickness direction occurring in the second collecting electrode 108b during firing is indicated by the length of the arrow in the two-dot chain line. Here, a sharp change in the stress in the thickness direction may occur in a region BD100 along the thickness direction from the inner edge portion IE100 of the hole portion CH100 of the second collecting electrode 108b being fired. As a result, as shown in FIG. 7, generation and development of a crack CK100 are likely to occur in the region BD100. Even after the second collecting electrode 108b is formed, the thermal expansion coefficient may differ approximately by one digit between the oxide film constituting the protective layer 106 and the metal element constituting the second collecting electrode 108b in some cases. For this reason, generation and development of the crack CK100 are likely to occur in the region BD100 in response to a change in the operating temperature of the solar cell element or the like. Therefore, due to the presence of the crack CK100, there is a risk that the power generation efficiency of the solar cell element is lowered due to an increase in electric resistance at the second collecting electrode 108b.

On the other hand, in the solar cell element 10 according to the first embodiment, as shown in FIG. 5, for example, the thickness of the protective layer 6 gradually increases from the inner edge portion IE1 of the hole portion CH1 to the periphery of the hole portion CH1. The thickness of the second collecting electrode 8b gradually decreases from the inner edge portion IE1 of the hole portion CH1 to the periphery of the hole portion CH1. Due to this, for example, when the second collecting electrode 8b is formed by firing the Al paste, the amount of heat shrinkage can gradually change in the second collecting electrode 8b being fired between a region from inside the hole portion CH1 to above the hole portion CH1 and a region on the protective layer 6 in the vicinity of the hole portion CH1. As a result, distortion occurring in the second collecting electrode 8b in the vicinity of the inner edge portion IE1 of the hole portion CH1 is reduced, and cracks are less likely to occur in the second collecting electrode 8b. Even after the second collecting electrode 8b is formed, even if the thermal expansion coefficient differs approximately by one digit or more between the protective layer 6 and the second collecting electrode 8b, distortion occurring in the second collecting electrode 8b in response to a change in the operating temperature of the solar cell element 10 in the vicinity of the inner edge portion IE1 of the hole portion CH1 can be reduced. As a result, generation and development of cracks in the second collecting electrode 8b are less likely to occur. Therefore, the power generation efficiency of the solar cell element 10 can be improved by reducing the electric resistance of the back-surface electrode 8 including the second collecting electrode 8b.

Further, for example, in the hole portion CH1, the inner diameter of the protective layer 6 shows a tendency to increase as a distance from the semiconductor substrate 1. In the example of FIG. 5, in a portion in the hole portion CH1 of the second collecting electrode 8b, a cross section P1a has a greater cross-sectional area than a cross section P1b closer to the semiconductor substrate 1 than the cross section P1a. Each of the cross section P1a and the cross section P1b is cross section substantially parallel to the second surface 1b of the semiconductor substrate 1. Due to this, for example, in the portion in the hole portion CH1 of the second collecting electrode 8b, the electric resistance shows a tendency to decrease as a distance from the semiconductor substrate 1. As a result, for example, the function of collection and transmission of carriers by the second collecting electrode 8b can be improved.

Incidentally, in the example of FIG. 2, the plurality of hole portions CH1 include a first hole portion CH11 and a second hole portion CH12 adjacent to each other. Here, for example, the first hole portion CH11 and the second hole portion CH12 are adjacent to each other in the +X direction. Here, for example, a conceivable case is that the first distance Wc1 between the position of the first region 6a being the thickness change region located around the first hole portion CH11 and being farthest from the inner edge portion IE1 and the inner edge portion IE1 is less than half of a distance (also referred to as a second distance) Wp1 between the first hole portion CH11 and the second hole portion CH12. In this case, for example, the thickness of the protective layer 6 can increase to some extent. Therefore, for example, the function of the protective layer 6 for protecting the passivation layer 4 can be secured. Here, when the second distance Wp1 is set to, for example, approximately from 0.3 mm to 2.5 mm, the first distance Wc1 can be set, for example, approximately from 0.15 mm to less than 1.25 mm.

Figure 9:
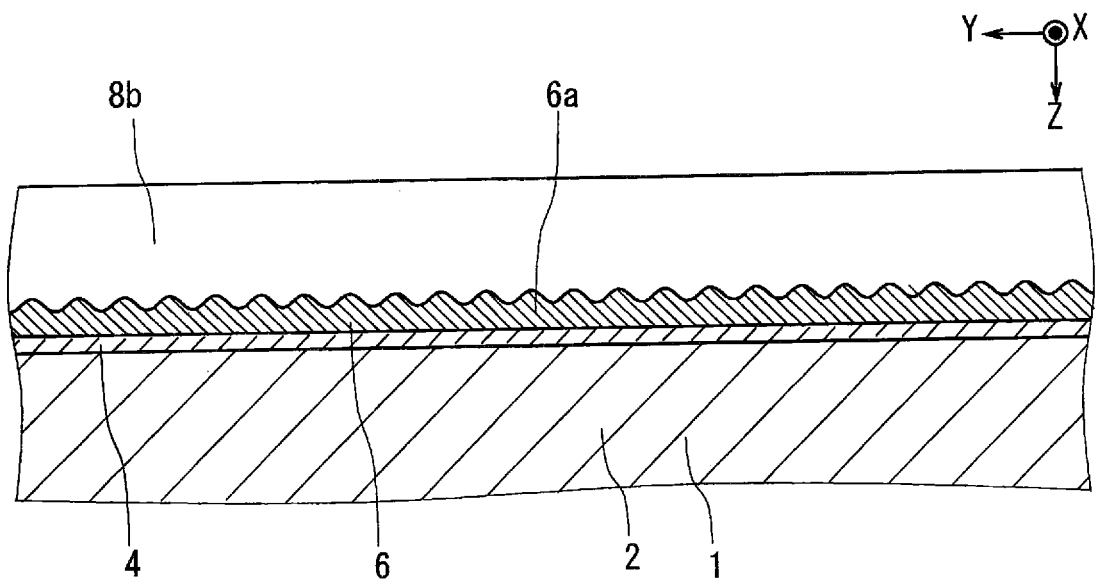
FIG. 9 illustrates a cross-sectional view showing an example of a part of a cross section of the solar cell element taken along the line IX-IX of FIG. 4.

Further, as shown in FIG. 4, the inner edge portion IE1 may include a concavo-convex portion in perspective plan view of the protective layer 6, for example. In this case, for example, the thickness of the protective layer 6 gradually increases toward various directions from the inner edge portion IE1 of the hole portion CH1. As shown in FIG. 9, for example, the surface of the first region 6a of the protective layer 6 on the second collecting electrode 8b side includes a concavo-convex portion on a cross section perpendicular to a direction (for example, +X direction) away from the inner edge portion IE1 of the hole portion CH1. In this case, the thickness of the second collecting electrode 8b gradually decreases toward various directions from the inner edge portion IE1 of the hole portion CH1. Due to this, for example, when the second collecting electrode 8b is formed by firing the Al paste, the amount of heat shrinkage can gradually change in the second collecting electrode 8b being fired between a region from inside the hole portion CH1 to above the hole portion CH1 and a region on the protective layer 6 in the vicinity of the hole portion CH1. As a result, distortion occurring in the second collecting electrode 8b in the vicinity of the inner edge portion IE1 of the hole portion CH1 is reduced, and cracks are less likely to occur in the second collecting electrode 8b. Even after the second collecting electrode 8b is formed, even if the thermal expansion coefficient differs approximately by one digit or more between the protective layer 6 and the second collecting electrode 8b, distortion occurring in the second collecting electrode 8b in response to a change in the operating temperature of the solar cell element 10 in the vicinity of the inner edge portion IE1 of the hole portion CH1 can be reduced. As a result, generation and development of cracks in the second collecting electrode 8b are less likely to occur. Therefore, the power generation efficiency of the solar cell element 10 can be improved by reducing the electric resistance of the back-surface electrode 8 including the second collecting electrode 8b.

Here, for example, the inner edge portion IE1 may have a wave-like shape in perspective plan view of the protective layer 6. In this case, for example, the surface of the first region 6a of the protective layer 6 on the second collecting electrode 8b side may have a wave-like shape on a cross section perpendicular to a direction (for example, +X direction) away from the inner edge portion IE1 of the hole portion CH1.

<1-3. Configuration in Vicinity of Outer Peripheral Edge Portion of Solar Cell Element>

Figure 11:
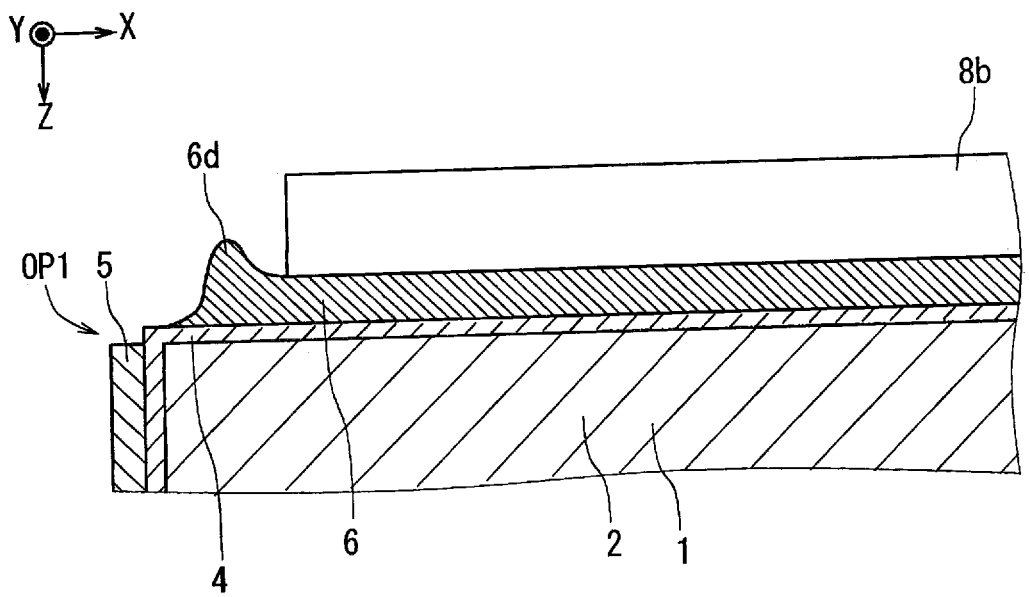
FIG. 11 illustrates a cross-sectional view showing an example of a part of a cross section of the solar cell element taken along the line XI-XI of FIG. 2.
Figure 12:
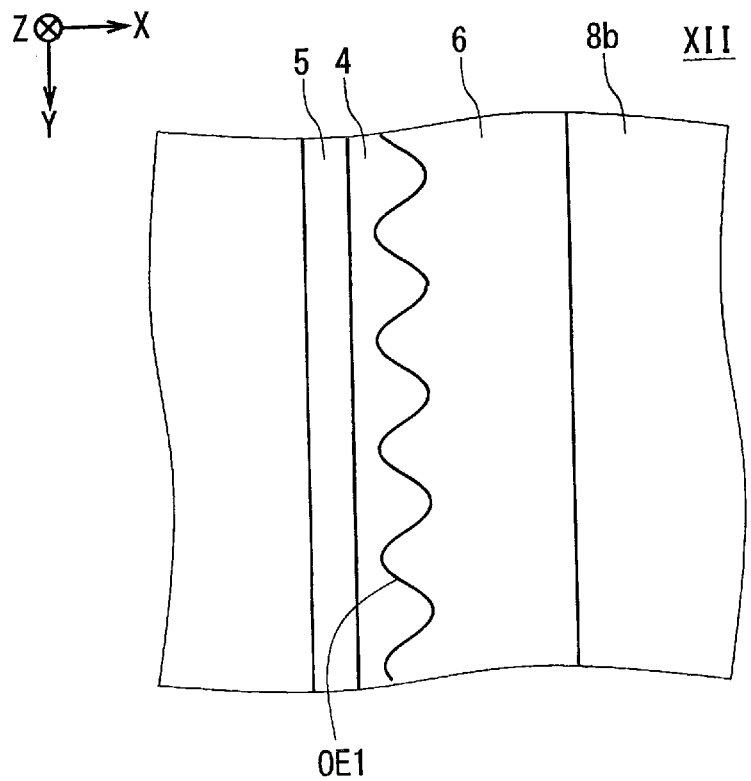
FIG. 12 illustrates an enlarged plan view showing the appearance of an example of the region XII in FIG. 2.

A schematic configuration of the vicinity of an outer peripheral edge portion OP1 of the solar cell element 10 according to the first embodiment will be described with reference to FIG. 10 to FIG. 12.

Figure 10:
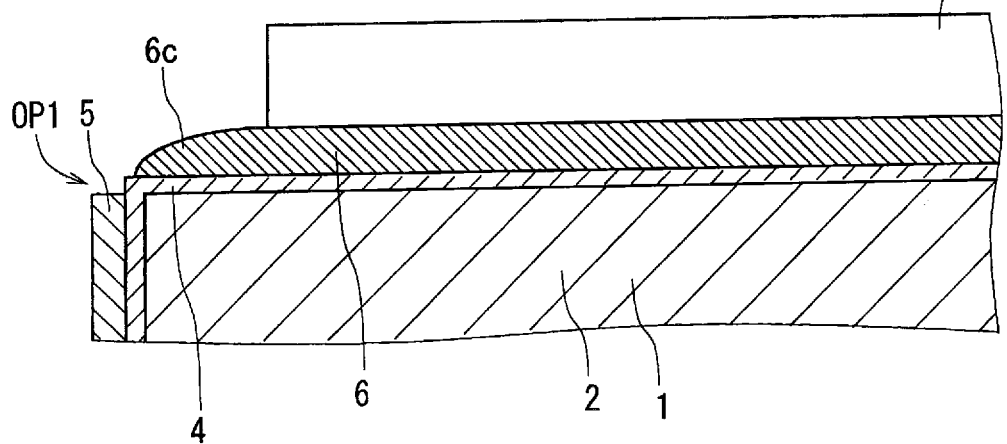
FIG. 10 illustrates a cross-sectional view showing an example of a part of a cross section of the solar cell element taken along the line X-X of FIG. 2.

In the vicinity of the outer peripheral edge portion OP1, for example, as shown in FIG. 10, the protective layer 6 may include a third region 6c in which the thickness simply decreases toward the outer peripheral edge portion OP1. Further, as shown in FIG. 11, the protective layer 6 may include a fourth region 6d in which the thickness decreases after once increased toward the outer peripheral edge portion OP1. Further, in the vicinity of the outer peripheral edge portion OP1, for example, as shown in FIG. 12, the protective layer 6 may include an outer edge portion having concavity and convexity (also referred to as a concavo-convex outer edge portion) OE1 in plan view. Here, the third region 6c may be formed by printing an insulation paste twice, for example. Specifically, for example, first, on the second surface 1b side of the semiconductor substrate 1, the insulation paste is applied up to a position where the distance from the end face 1c is relatively short with the center side as a start point. Thereafter, the third region 6c can be formed by applying the insulation paste up to a position where the distance from the end face 1c is relatively long. Further, the fourth region 6d can be formed by printing twice, for example. Specifically, for example, on the second surface 1b side of the semiconductor substrate 1, first, the insulation paste is applied from the target region where the fourth region 6d is formed (also referred to as a formation target region) to a region outside the formation target region. Thereafter, the fourth region 6d can be formed by a method of applying the insulation paste from the formation target region to a region inside the formation target region, or the like. Further, the concavo-convex outer edge portion OE1 can be formed by applying the insulation paste appropriately using a mask or the like, for example.

Incidentally, it is assumed a case where the protective layer 106 having a substantially constant thickness is formed by a dry process such as CVD, plasma CVD, or sputtering, for example. In this case, for example, as shown in FIG. 13, in the protective layer 106, the third region 6c in which the thickness simply decreases toward the outer peripheral edge portion OP1 and the fourth region 6d in which the thickness decreases after once increased toward the outer peripheral edge portion OP1 are unlikely to occur. In this case, for example, the concavo-convex outer edge portion OE1 is also unlikely to occur in the protective layer 106.

1-4. Insulation Paste

The insulation paste includes, for example, a siloxane resin, an organic solvent, and a plurality of fillers. The siloxane resin is a siloxane compound having a Si—O—Si bond (siloxane bond). Specifically, as the siloxane resin, for example, a low molecular weight resin having a molecular weight of 10,000 or less generated by hydrolyzing and condensation polymerizing alkoxysilane, silazane, or the like is adopted. Further, the insulation paste may contain chlorine.

1-5. Production of Insulation Paste

Figure 14:
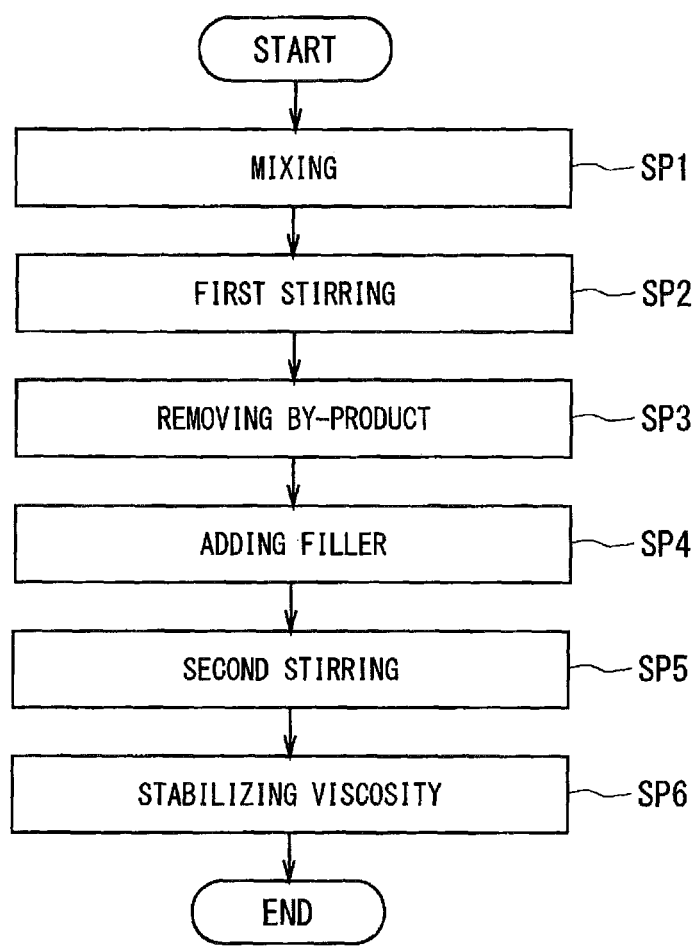
FIG. 14 illustrates a flowchart showing an example of a flow relating to generation of an insulation paste.
Figure 15:
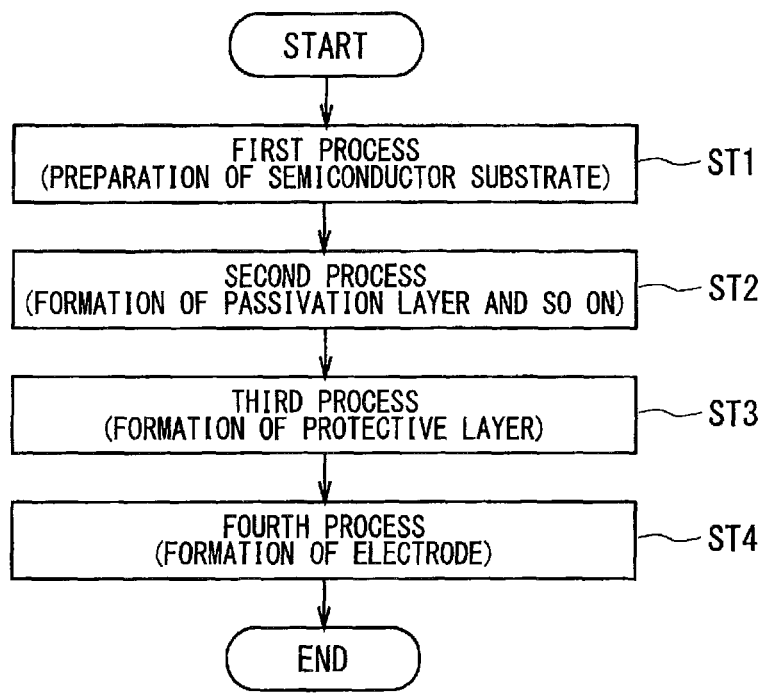
FIG. 15 illustrates a flowchart showing an example of a flow relating to manufacture of the solar cell element.

A method for manufacturing the insulation paste will be described with reference to FIG. 14. Here, for example, the insulation paste can be produced by performing the process of step SP1, step SP2, step SP3, step SP4, step SP5, and step SP6 shown in FIG. 14 in this order.

First, in step SP1, a process of preparing a mixed solution by mixing a precursor of siloxane resin, water, an organic solvent, and a catalyst in a container (also referred to as a mixing process) is performed.

As the precursor of the siloxane resin, for example, a silane compound including a Si—O bond, a silazane compound having a Si—N bond, or the like can be adopted. These compounds have hydrolytic properties (also referred to as hydrolysable properties). In addition, the precursor of the siloxane resin turns into a siloxane resin through hydrolysis and condensation polymerization.

The silane compound is expressed by the following general formula 1.

$(R1)_n Si(OR2)_{(4-n)}$ (general formula 1).

In the general formula 1, n is any of the integers 0, 1, 2, and 3, for example. R1 and R2 in the general formula 1 denote alkyl groups ($—C_m H_{2m+1}$) such as a methyl group ($—CH_3$) and an ethyl group ($—C_2 H_5$) or hydrocarbon groups such as a phenyl group ($—C_6 H_5$). Here, m is a natural number.

Here, the silane compound includes, for example, a silane compound in which at least R1 contains an alkyl group (also referred to as an alkyl group-based silane compound). Specifically, examples of the alkyl group-based silane compound include methyltrimethoxysilane ($CH_3$—Si—(O-$CH_3$)$_3$), dimethyldimethoxysilane (($CH_3$)$_2$—Si—(O$CH_3$)$_2$), Triethoxymethylsilane ($CH_3$—Si—(O$C_2H_5$)$_3$), diethoxydimethylsilane (($CH_3$)$_2$—Si—(O$C_2H_5$)$_2$), trimethoxypropylsilane (($CH_3$O)$_3$—Si—($CH_2$)$_2$$CH_3$), triethoxypropylsilane (($C_2H_5$O)$_3$—Si—($CH_2$)$_2$$CH_3$), hexyltrimethoxysilane (($CH_3$O)$_3$—Si—($CH_2$)$_5$$CH_3$), triethoxyhexylsilane (($C_2H_5$O)$_3$—Si—($CH_2$)$_5$$CH_3$), triethoxyoctylsilane (($C_2H_5$O)$_3$—Si—($CH_2$)$_7$$CH_3$) and decyltrimethoxysilane (($CH_3$O)$_3$—Si—($CH_2$)$_9$$CH_3$), and the like.

Here, for example, if the alkyl group is a methyl group, an ethyl group, or a propyl group, alcohol as a by-product including a small number of carbon atoms and easily volatilizing when hydrolyzing the precursor of the siloxane resin can be generated. As a result, by-products tend to be removed in the by-product removing process described later. As a result, for example, when forming the protective layer 6, generation of vacancies due to evaporation of by-products hardly occurs, so that the protective layer 6 becomes dense and the barrier function of the protective layer 6 can be improved.

Here, for example, when the precursor of the siloxane resin includes a phenyl group, the precursor of the siloxane resin undergoes hydrolysis and condensation polymerization and may be used in the mixing process in a state of being made into a siloxane resin in which by-products generated by hydrolysis and condensation polymerization of the phenyl group have been removed. Due to this, for example, variation of the viscosity of the insulation paste due to the hydrolysis reaction of the siloxane resin is reduced, and the viscosity of the insulation paste is easily stabilized. Further, for example, when an insulation paste is generated by mixing a siloxane resin, an organic solvent, and a filler in a state where by-products have been removed, the amount of by-products contained in the insulation paste is reduced. Therefore, if such an insulation paste is generated, for example, in the case where the insulation paste is applied by screen printing, dissolution of an emulsion used in screen plate making by byproducts can be reduced. As a result, dimensions of a pattern in screen plate making is hard to vary.

Also, the silane compound includes, for example, silane compounds in which R1 and R2 contain both a phenyl group and an alkyl group. Examples of such silane compound include trimethoxyphenylsilane ($C_6H_5$—Si—$(OCH_3)_3$), dimethoxydiphenylsilane (($C_6H_5)_2$—Si—$(OCH_3)_2$), methoxytriphenylsilane (($C_6H_5)_3$—Si—$OCH_3$), triethoxyphenylsilane ($C_6H_5$—Si—$(OC_2H_5)_3$), diethoxydiphenylsilane (($C_6H_5)_2$—Si—$(OC_2H_5)_2$), ethoxytriphenylsilane (($C_6H_5)_3$—Si—$OC_2H_5$), triisopropoxyphenylsilane ($C_6H_5$—Si—$(OC_3H_7)_3$), diisopropoxydiphenylsilane (($C_6H_5)_2$—Si—$(OC_3H_7)_2$), isopropoxytriphenylsilane (($C_6H_5)_3$—Si—$OC_3H_7$) and the like.

Among these silane compounds, for example, if a silane compound containing two or more OR bonds is adopted, the number of siloxane bonds (Si—O—Si bonds) generated by generating condensation polymerization after hydrolysis of the silane compound can increase. This can increase the network of siloxane bonds in the silicon oxide forming the protective layer 6. As a result, the barrier function of the protective layer 6 can be improved.

In addition, the silazane compound may be either an inorganic silazane compound or an organic silazane compound. Here, examples of inorganic silazane compound include polysilazane (—($H_2SiNH$)—). Examples of organic silazane compound include hexamethyldisilazane (($CH_3)_3$—Si—NH—Si—$(CH_3)_3$), tetramethylcyclodisilazane (($CH_3)_2$—Si—$(NH)_2$—Si—$(CH_3)_2$), tetraphenylcyclodisilazane (($C_6H_5)_2$—Si—$(NH)_2$—Si—$(C_6H_5)_2$) and the like.

Water is a liquid used for causing hydrolysis of the precursor of the siloxane resin. For example, pure water is used as water. For example, water reacts with the bond of Si—$OCH_3$ of the silane compound, thereby generating Si—OH bond and HO—$CH_3$ (methanol).

The organic solvent serves as a solvent for producing a paste containing siloxane resin from the precursor of the siloxane resin. In addition, the organic solvent can mix water with the precursor of the siloxane resin. For example, diethyleneglycolmonobutylether, methylcellosolve, ethylcellosolve, ethyl alcohol, 2-(4-methylcyclohexa-3-enyl)propane-2-ol, 2-propanol, or the like is used as the organic solvent. Here, from among these organic solvents, any of one type of organic solvent and an organic solvent in which two or more types of organic solvents are mixed may be used.

The catalyst can control a reaction rate during hydrolysis and condensation polymerization of the precursor of the siloxane resin. For example, Si—OR bonds (for example, R is the alkyl group) contained in the precursor of the siloxane resin are caused to undergo hydrolysis and condensation polymerization, thereby allowing the rate of the reaction of production of Si—O—Si bonds and $H_2O$ (water) from two or more Si—OH to be adjusted. As the catalyst, for example, at least one type of inorganic acid or at least one type of organic acid among hydrochloric acid, nitric acid, sulfuric acid, boric acid, phosphoric acid, hydrofluoric acid, acetic acid, and the like is used. As the catalyst, for example, at least one type of an inorganic base or at least one type of an organic base among ammonia, sodium hydroxide, potassium hydroxide, barium hydroxide, calcium hydroxide, pyridine, and the like may further be used. The catalyst may further be, for example, a combination of inorganic acid and organic acid, or a combination of an inorganic base and an organic base.

The mixing percentages of the materials mixed together in the mixing process are adjusted so as to be 10% by mass to 90% by mass of the concentration of the precursor of the siloxane resin, 5% by mass to 40% by mass (or 10% by mass to 20% by mass) of the concentration of the water, 1 ppm to 1,000 ppm of the concentration of the catalyst, and 5% by mass to 50% by mass of the concentration of the organic solvent, in the mixed solution after mixing all the materials, for example. With such mixing percentages, for example, the siloxane resin produced by hydrolysis and condensation polymerization of the precursor of the siloxane resin can thereby be contained in the insulation paste at an appropriate concentration. In addition, excessive increase in viscosity due to gelation hardly occurs in the insulation paste, for example.

In such the mixing process, the precursor of the siloxane resin reacts with water to start hydrolysis of the precursor of the siloxane resin. The hydrolyzed precursor of the siloxane resin then is caused to undergo condensation polymerization to start generation of the siloxane resin.

Further, a chlorine compound may be mixed in the mixed solution. This chlorine compound is expressed by the following general formula 2, for example. In the case where the above-described chlorine compound is not mixed with the mixed solution in the mixing process, the chlorine compound may be added to the mixed solution in a process subsequent to the mixing process.

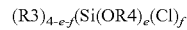

$(R3)_{4-e-f}(Si(OR4))_e(Cl)_f$         (General formula 2).

Here, R3 and R4 in the general formula 2 denote, for example, alkyl groups such as a methyl group or an ethyl group or hydrocarbon groups such as a phenyl group. Also, e in the general formula 2 is any one integer of 1, 2, and 3. f is any one integer of 1 and 2. e+f is any one integer of 2, 3, and 4. e+f is, for example, 3 or 4. R3 and R4 may be the same alkyl group or phenyl group, or may not be the same alkyl group or phenyl group. In the mixed solution, for example, the chlorine compound may include Si—Cl bond and be contained in a state where hydrolysis reaction has not occurred.

Further, chloride and the like may be mixed in the mixed solution. As the chloride, for example, zinc chloride ($ZnCl_2$), magnesium chloride ($MgCl_2$), tin chloride ($SnCl_2$), or the like is adopted.

Next, in step SP2, a process of stirring the mixed solution prepared in step SP1 (also referred to as a first stirring process) is performed. Here, the mixed solution is stirred with, for example, a mixing rotor, a stirrer or the like. Hydrolysis of the precursor of the siloxane resin further progresses by stirring the mixed solution. The hydrolyzed precursor of the siloxane resin then undergoes condensation polymerization to continuously generate the siloxane resin. In a case where the mixed solution is stirred with the mixing rotor, for example, stirring conditions in which the rotational speed of the rotational roller of the mixing rotor is approximately from 400 rpm to 600 rpm and the stirring time is approximately from 30 minutes to 90 minutes are adopted. The precursor of the siloxane resin, water, the catalyst, and the organic solvent can uniformly be mixed together if the stirring conditions are adopted. In addition, in the first stirring process, for example, when the mixed solution is heated, hydrolysis and condensation polymerization of the precursor of the siloxane resin are likely to proceed. Due to this, for example, the productivity can be improved by shortening the stirring time, and the viscosity of the mixed solution becomes easily stabilized in the process after the first stirring process.

Next, in step SP3, a process of removing by-products from the mixed solution stirred in step SP2 (also referred to as a by-product removing process) is performed. In this process, water, the catalyst, and a by-product of an organic component such as alcohol are volatilized. The by-product is generated by reaction of the precursor of the siloxane resin and water. By removing the by-product, variation of the viscosity of the insulation paste attributable to volatilization of the organic component as a by-product can be reduced in storing the insulation paste or in continuously applying the insulation paste. If the insulation paste is applied using screen printing, an emulsion used in screen plate making becomes less likely to be dissolved by the organic component as a by-product. This can reduce variation of dimensions of a pattern in screen plate making. The hydrolyzed precursor of the siloxane resin is caused to undergo condensation polymerization to continuously generate the siloxane resin also in the by-product removing process. In addition, condensation polymerization of the precursor of the siloxane resin can be reduced because water and the catalyst are volatilized in the by-product removing process. This can reduce variation of the viscosity of the mixed solution.

In the first embodiment, in the by-product removing process, the catalyst added in the mixing process is volatilized. Therefore, for example, when hydrochloric acid is used as a catalyst, chlorine is removed in the by-product removing process. Therefore, chlorine may be contained in the mixed solution by adding to the mixed solution hydrochloric acid or a compound containing chlorine in a part of alkoxysilane expressed by the above general formula 1, after the by-product removing process, for example. Further, chloride with zinc, magnesium, tin, or the like may be mixed to the mixed solution.

In the by-product removing process, the stirred mixed solution is treated using a hot plate, a drying oven, or the like under conditions of a treatment temperature ranging from room temperature to approximately 90° C. (may be approximately from 50° C. to 90° C.) and the treatment time of approximately from 10 minutes to 600 minutes, for example. The by-product can be removed if the treatment temperature is within the temperature range. The treatment time can be shortened and the productivity can be improved, because the organic component that is a by-product easily volatilizes in the temperature range. Here, the organic component that is the by-product easily volatilizes with the by-product removing process performed under a reduced pressure, for example. As a result, the productivity can be improved by shortening the treatment time. Further, for example, the precursor of the siloxane resin remaining in the first stirring process without being hydrolyzed may be further hydrolyzed in the by-product removing process.

Next, in step SP4, a process (also referred to as a filler adding process) of adding a filler to the mixed solution from which by-products have been removed in step SP3 is performed. Here, for example, inorganic fillers containing a silicon oxide, an aluminum oxide, a titanium oxide, or the like can be adopted as the fillers. For example, the filler may be added to the mixed solution so that the concentration of the filler in the mixed solution after the filler is added may be from 3% by mass to 30% by mass (may also be from 5% by mass to 25% by mass). The viscosity of the mixed solution can be easily adjusted by performing the filler adding process after the first stirring process.

Next, in step SP5, a process (also referred to as a second stirring process) of stirring the mixed solution to which the filler is added in step SP4 is performed. Here, the mixed solution is stirred with, for example, a rotation and revolution mixer or the like. The mixed solution is stirred with the rotation and revolution mixer, for example, under conditions of the rotational speed of the rotation portion and the revolution portion of approximately from 800 rpm to 1,000 rpm and the stirring time of approximately from 1 minute to 10 minutes. The fillers can uniformly be dispersed in the mixed solution if such conditions are adopted.

Next, in step SP6, a process of stabilizing the viscosity of the mixed solution stirred in step SP5 (also referred to as a viscosity stabilizing process) is performed. The mixed solution is herein kept in storage, for example, at room temperature for approximately from 2 hours to 24 hours, thereby stabilizing the viscosity of the mixed solution. Due to this, the insulation paste is prepared. When the viscosity of the insulation paste is adjusted herein from 5 Pa·sec to 400 Pa·sec at a shearing speed of 1/sec, for example, bleeding can be reduced in applying the insulation paste using screen printing. In this case, for example, the insulation paste can easily be applied in a pattern with a hole portion whose width is approximately from several tens of micrometers to several hundreds of micrometers. As a result, the protective layer 6 can be formed by applying the insulation paste to a desired pattern using screen printing and drying the insulation paste. The viscosity of the insulation paste can be measured using a viscosity-viscoelasticity measuring instrument or the like, for example.

In the series of the processes from step SP1 to step SP6, the viscosity stabilizing process can be omitted if the viscosity of the mixed solution is stabilized in the second stirring process, for example. Further, for example, addition of the filler may be performed in the mixing process. In this case, the filler adding process and the second stirring process are unnecessary. As a result, productivity is improved. It is not necessary to perform the by-product removing process in a case of applying the insulation paste by spraying or the like using a mask when forming the protective layer 6, for example. For example, a mixed solution containing the precursor of the siloxane resin including an alkyl group may be generated in the mixing process, and then a siloxane resin including a phenyl group may be added to the mixed solution in a filler adding process.

1-6. Method for Manufacturing Solar Cell Element

An example of a method for manufacturing the solar cell element 10 will be described on a basis of FIG. 15 and FIG. 16A to FIG. 16F. Here, the solar cell element 10 can be manufactured by performing the process of step ST1, step ST2, step ST3, and step ST4 shown in FIG. 15 in this order.

First, in step ST1, a process (also referred to as a first process) of preparing the semiconductor substrate 1 is performed. The semiconductor substrate 1 has a first surface 1a and a second surface 1b facing a direction opposite to the first surface 1a.

Figure 16A:
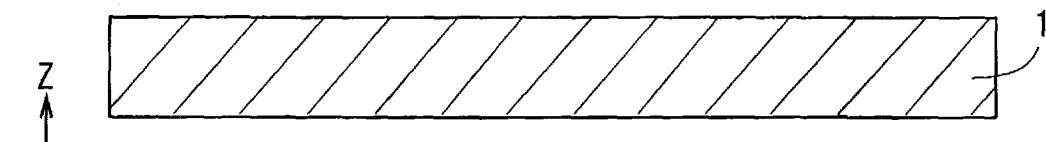
FIG. 16A to FIG. 16E each illustrates a view showing an example of a cross section corresponding to the cross section of FIG. 3 in the middle of manufacturing a solar cell element.

Here, for example, first, the semiconductor substrate 1 is prepared as shown in FIG. 16A. The semiconductor substrate 1 can be formed using, for example, an existing CZ method, a casting method, or the like. Here, an example using an ingot of a p-type polycrystalline silicon prepared by casting will be described. The ingot is cut into slices each having a thickness of 250 μm or less, for example, to prepare the semiconductor substrate 1. Here, for example, when a very small amount of etching is performed with an aqueous solution of sodium hydroxide, potassium hydroxide, hydrofluoric acid, hydrofluoric-nitric acid, or the like on the surface of the semiconductor substrate 1, a mechanicallydamaged layer and a contaminated layer of the cut surface of the semiconductor substrate 1 can be removed.

Figure 16B:
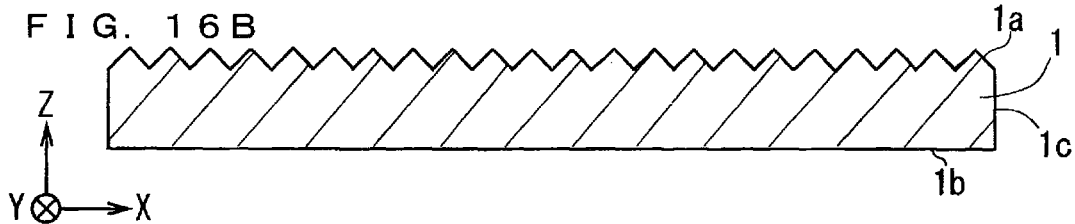

Next, a texture is formed on the first surface 1a of the semiconductor substrate 1 as shown in FIG. 16B. The texture can be formed by wet etching using an alkaline aqueous solution such as sodium hydroxide or an acidic aqueous solution such as hydrofluoric-nitric acid, or by dry etching such as reactive ion etching (RIE).

Figure 16C:
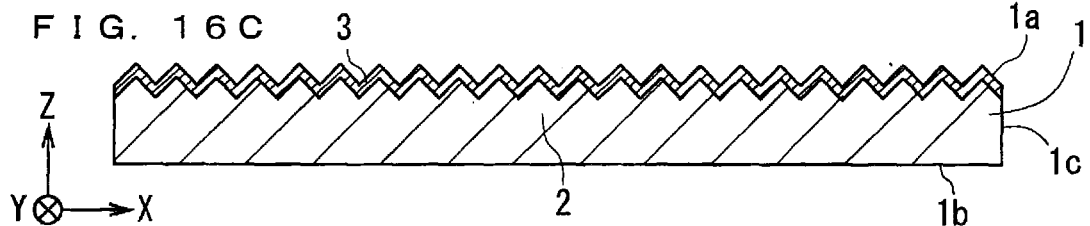

Next, as shown in FIG. 16C, the second semiconductor layer 3 as an n-type semiconductor region is formed at the first surface 1a of the semiconductor substrate 1 having the texture. Specifically, the n-type second semiconductor layer 3 is formed at the surface layer portion of the first surface 1a side of the semiconductor substrate 1 having the texture. The second semiconductor layer 3 can be formed by application thermal diffusion method in which a diphosphoruspentaoxide ($P_2O_5$) paste is applied onto the surface of the semiconductor substrate 1 and phosphorus is thermally diffused, gas phase thermal diffusion method using a phosphorus oxychloride ($POCl_3$) gas as the source of diffusion, or the like, for example. The second semiconductor layer 3 is formed to have a depth of approximately from 0.1 μm to 2 μm and a sheet resistance of approximately from 40Ω/□ to 200Ω/□.

In the gas phase thermal diffusion method, first, the semiconductor substrate 1 is heat treated in an atmosphere of a diffused gas containing mainly $POCl_3$ and the like at a temperature of approximately from 600° C. to 800° C. for approximately from 5 minutes to 30 minutes to form phosphorus glass on the surface of the semiconductor substrate 1, for example. The semiconductor substrate 1 is then heat treated in an atmosphere of an inert gas such as argon or nitrogen at a relatively high temperature of approximately 800° C. to 900° C. for approximately 10 minutes to 40 minutes. Phosphorus is thereby diffused from the phosphorus glass into the semiconductor substrate 1 to form the second semiconductor layer 3 at the surface layer portion of the first surface 1a side of the semiconductor substrate 1.

Here, when the second semiconductor layer 3 is formed, the second semiconductor layer may be formed also on the second surface 1b side in some cases. In this case, the second semiconductor layer formed on the second surface 1b side of the semiconductor substrate 1 is removed by etching. For example, the second semiconductor layer formed on the second surface 1b side of the semiconductor substrate 1 can be removed by immersing a portion of the semiconductor substrate 1 on the second surface 1b side in an aqueous solution of hydrofluoric-nitric acid. A region having a p-type conductivity can thereby be exposed on the second surface 1b of the semiconductor substrate 1. Then, the phosphorus glass, which has adhered to the first surface 1a side of the semiconductor substrate 1 during the formation of the second semiconductor layer 3, is then removed by etching. Removal of and damage to the second semiconductor layer 3 on the first surface 1a side of the semiconductor substrate 1 can be reduced by removing the second semiconductor layer formed on the second surface 1b side of the semiconductor substrate 1 by etching in a state of allowing the phosphorus glass to remain on the first surface 1a side as described above. At this time, the second semiconductor layer formed on the end face 1c of the semiconductor substrate 1 may also be removed.

For example, a diffusion mask may be formed in advance on the second surface 1b side of the semiconductor substrate 1 to form the second semiconductor layer 3 by gas phase thermal diffusion method and the like, and then the diffusion mask may be removed. In this case, since the second semiconductor layer is not formed on the second surface 1b side of the semiconductor substrate 1, the process of removing the second semiconductor layer on the second surface 1b side of the semiconductor substrate 1 is unnecessary.

The semiconductor substrate 1 including the first semiconductor layer 2 that includes the second semiconductor layer 3 as the n-type semiconductor layer located on the first surface 1a side of the semiconductor substrate 1 and that has the texture on the first surface 1a can be prepared in the above-mentioned treatment.

Next, in step ST2, a process (also referred to as a second process) of forming the passivation layer 4 is performed. In the first embodiment, the passivation layer 4 is formed at least on the second surface 1b of the semiconductor substrate 1.

Figure 16D:
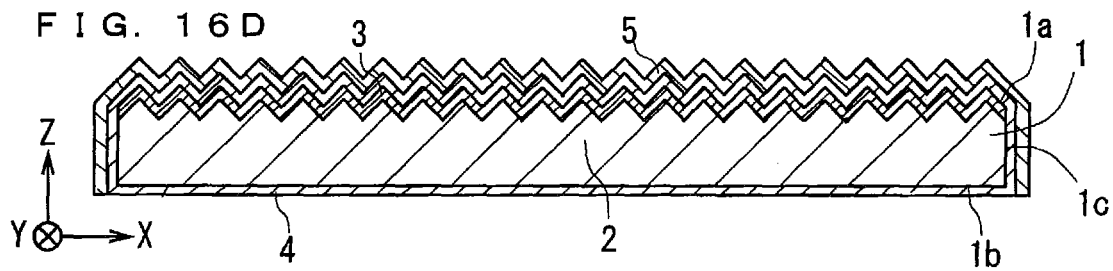

Here, for example, as shown in FIG. 16D, the passivation layer 4 mainly containing aluminum oxide is formed on the second surface 1b of the first semiconductor layer 2 and on the first surface 1a of the second semiconductor layer 3. Further, the antireflection layer 5 is formed on the passivation layer 4. The antireflection layer 5 contains, for example, a silicon nitride film or the like.

The passivation layer 4 can be formed by, for example, ALD or the like. The passivation layer 4 can be formed by ALD on the entire surface including the end face 1c of the semiconductor substrate 1, for example. In the formation process of the passivation layer 4 by ALD, the semiconductor substrate 1 in which the second semiconductor layer 3 has been formed is first placed in a chamber of a layer formation apparatus. The following processes A to D are repeated a plurality of times while heating the semiconductor substrate 1 to a temperature range of approximately 100° C. to 250° C. to form the passivation layer 4 mainly containing the aluminum oxide. The passivation layer 4 having a desired thickness is thereby formed.

[Process A] An aluminum material, such as trimethylaluminum (TMA), for formation of an aluminum oxide is supplied to the semiconductor substrate 1 along with a carrier gas such as an Ar gas and a nitrogen gas. The aluminum material is thereby absorbed onto the entire surface of the semiconductor substrate 1. A time to supply the TMA is approximately 15 msec to 3,000 msec, for example. The surface of the semiconductor substrate 1 may be terminated by the OH group at the start of the process A. In other words, the surface of the semiconductor substrate 1 may have an Si—O—H structure. This structure can be formed by cleaning the semiconductor substrate 1 with pure water after treatment with diluted hydrofluoric acid, for example.

[Process B] The chamber of the layer formation apparatus is purified with a nitrogen gas to remove the aluminum material in the chamber. An aluminum material other than a component chemically absorbed at an atomic layer level is further removed from the aluminum material physically and chemically absorbed onto the semiconductor substrate 1. The chamber is purified with the nitrogen gas for approximately one second to dozens of seconds, for example.

[Process C] An oxidizer, for example, water or an ozone gas is supplied into the chamber of the layer formation apparatus to remove the alkyl group included in TMA so that the OH group is substituted for the alkyl group. An atomic layer of an aluminum oxide is thereby formed on the semiconductor substrate 1. The oxidizer is supplied into the chamber for approximately 750 msec to 1,100 msec, for example. Hydrogen atoms are easily included in the aluminum oxide by supplying hydrogen along with the oxidizer into the chamber, for example.

[Process D] The chamber of the layer formation apparatus is purified with a nitrogen gas to remove the oxidizer in the chamber. Here, for example, an oxidizer not having contributed to reaction during formation of the aluminum oxide at the atomic layer level on the semiconductor substrate 1 is removed. Here, the chamber is purified with the nitrogen gas for approximately one second to dozens of seconds, for example.

A series of process in which the process A, the process B, the process C, and the process D are performed in this order as described is thereafter repeated a plurality of times to form the aluminum oxide layer having a desired thickness.

The antireflection layer 5 is formed by PECVD or sputtering, for example. If PECVD is applied, the semiconductor substrate 1 is preheated to a temperature higher than a temperature at which the antireflection layer 5 is formed. Then, a mixed gas of silane ($SiH_4$) and ammonia ($NH_3$) is diluted with nitrogen ($N_2$) gas. The diluted gas is plasmatized by glow discharge decomposition at a reaction pressure of approximately 50 Pa to 200 Pa, and deposited on the heated semiconductor substrate 1. The antireflection layer 5 is thereby formed on the semiconductor substrate 1. Here, the layer forming temperature is approximately 350° C. to 650° C., and the preheating temperature of the semiconductor substrate 1 is set higher than the layer forming temperature by approximately 50° C. A frequency of approximately 10 kHz to 500 kHz is adopted as a frequency of high-frequency power supply required for glow discharge. A flow rate of the gas is appropriately determined in accordance with the size of the chamber and the like. The flow rate of the gas ranges approximately from 150 ml/min (sccm) to 6,000 ml/min (sccm), for example. At this time, a value (B/A) of the flow rate B of ammonia gas divided by the flow rate A of silane gas ranges from 0.5 to 15.

Next, in step ST3, a process (also referred to as a third process) of forming the protective layer 6 is performed. In the first embodiment, at least on the second surface 1*b* side of the semiconductor substrate 1, the protective layer 6 is formed by applying a solution so as to form a pattern including the hole portion CH1 on the passivation layer 4 and drying this solution. At this time, for example, an insulation paste is used as the solution. The protective layer 6 includes the first region 6*a* as a thickness change region showing a tendency to increase in thickness as a distance from the inner edge portion IE1 of the hole portion CH1. The protective layer 6 whose thickness increases as a distance from the inner edge portion IE1 of the hole portion CH1 increases can be formed by printing twice, for example. Specifically, it can be formed by a method of applying, for example, after the insulation paste is applied so as to form the pattern having the hole portion CH1, the insulation paste so as to form a pattern having a hole portion in which the distance from the center of the hole portion CH1 is larger than the hole portion CH1 in the radial direction of the hole portion CH1 over the circumference surface of the hole portion CH1.

Figure 16E:
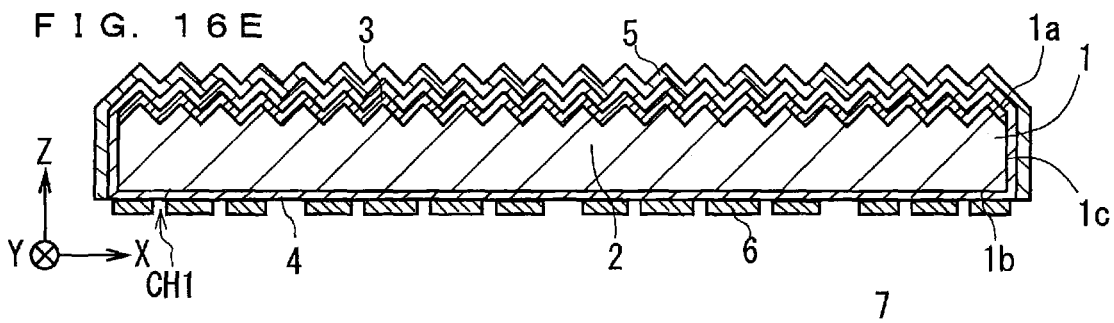

Here, for example, as shown in FIG. 16E, the protective layer 6 is formed on at least a part of the passivation layer 4. For example, first, the above-described insulation paste is applied in a desired pattern to at least a part of the passivation layer 4 using screen printing or the like. The applied insulation paste is dried under the conditions of the maximum temperature of approximately from 150° C. to 350° C. and a heating time of approximately from 1 minute to 10 minutes, using a hot plate, a drying oven, or the like. The protective layer 6 having a desired pattern is thereby formed on the passivation layer 4. At this time, the first region 6*a* showing a tendency of thickness decreasing toward the above-described inner edge portion IE1 and the second region 6*b* having a substantially uniform thickness can be formed depending on the wettability with respect to the passivation layer 4, the surface tension, the viscosity, the own weight, and the like of the insulation paste.

In the third process, when the protective layer 6 is formed by applying the insulation paste, the above-described third region 6*c* (FIG. 10 and the like), the fourth region 6*d* (FIG. 11 and the like), and the concavo-convex outer edge portion OE1 (FIG. 12 and the like) can be appropriately formed in the vicinity of the outer peripheral edge portion OP1 of the solar cell element 10. At this time, the occurrence frequency, size, shape, and the like of the concavo-convex outer edge portion OE1 are changed depending on the characteristics such as the viscosity of the insulation paste for forming the protective layer 6, the coating conditions such as the liquid amount of the insulation paste, and the like.

Here, for example, if the insulation paste contains chlorine, in a case where the protective layer 6 is formed by applying the insulation paste, the protective layer 6 containing chlorine can be formed. The content of chlorine in the insulation paste can be set to approximately from 1 ppm to 10,000 ppm, for example.

Here, for example, if the low molecular component of the siloxane resin remains in the protective layer 6, the low molecular component of the siloxane resin is prone to volatilize in the firing process of the metal paste for forming the back-surface electrode 8 described later. At this time, the low molecular component of the siloxane resin having volatilized adheres between the metal powders for forming the back-surface electrode 8 and inhibits sintering of the metal powder. For this reason, the electric resistance of the back-surface electrode 8 formed by firing may increase. hi addition, if the low molecular components of the siloxane resin have volatilized, voids may be generated in the protective layer 6. On the other hand, if the protective layer 6 is prepared by using the insulation paste containing chlorine, in the drying process of the insulation paste for forming the protective layer 6 and the firing process of the metal paste for forming the back-surface electrode 8, the low molecular component of the siloxane resin remaining in the protective layer 6 tends to cause a reaction of condensation polymerization. The low molecular component of the siloxane resin remaining in the protective layer 6 thereby decreases. As a result, in the solar cell element 10 according to the first embodiment, the electrical resistance of the back-surface electrode 8 hardly rises, and voids are unlikely to be generated in the protective layer 6.

Further, after a first insulation paste containing chlorine is applied, a second insulation paste containing more chlorine than the first insulation paste may be applied. As a result, the content of chlorine in the protective layer 6 in the portion located on the back-surface electrode 8 side can be greater than that in the portion located on the passivation layer 4 side.

As described above, in the portion of the protective layer 6 on the back-surface electrode 8 side, since the content of chlorine is large, voids due to volatilization of low molecular components of the siloxane resin are unlikely to be generated. This makes it difficult for the protective layer 6 and the passivation layer 4 to be fired through during firing of the Al paste, for example. As a result, the output characteristics of the solar cell element 10 are hardly deteriorated.

Next, in step ST4, a process of forming an electrode including the front-surface electrode 7 and the back-surface electrode 8 (also referred to as a fourth process) is performed. Here, for example, a material for electrode formation is disposed on the protective layer 6 and in the hole portion CH1, and the material for electrode formation is heated, thereby forming the back-surface electrode 8. The back-surface electrode 8 formed at this time includes the second extracting electrode 8a and the second collecting electrode 8b. The second collecting electrode 8b includes the electrode layer 8b1 located on the protective layer 6 and the connecting portion 8b2 located so as to penetrate the passivation layer 4 from the hole portion CH1 of the protective layer 6 and electrically connected to the semiconductor substrate 1.

Figure 16F:
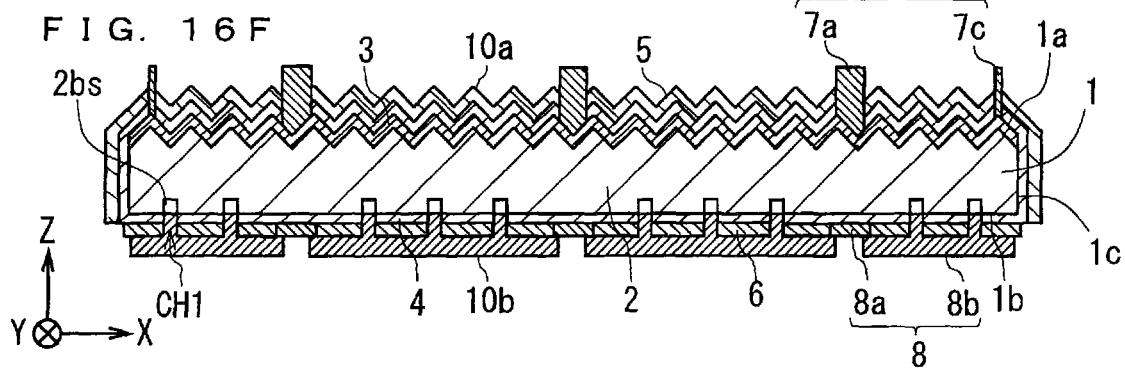
FIG. 16F illustrates a view showing an example of a cross section of the solar cell element in a state where the solar cell element has been manufactured.

Here, for example, as shown in FIG. 16F, the front-surface electrode 7 and the back-surface electrode 8 are formed.

The front-surface electrode 7 is prepared using a first metal paste including a metal powder containing silver as a main component, an organic vehicle, and a glass frit (also referred to as a silver paste), for example. First, the first metal paste is applied to the first surface 1a side of the semiconductor substrate 1. In the first embodiment, the first metal paste is applied on the antireflection layer 5 formed on the passivation layer 4 on the first surface 1a. Here, the application of the first metal paste can be realized by, for example, screen printing or the like. After the application of the first metal paste, the first metal paste may be dried by vaporizing a solvent in the first metal paste at a predetermined temperature. For example, the first extracting electrode 7a, the first collecting electrode 7b, and the auxiliary electrode 7c included in the front-surface electrode 7 can be formed in one process if the first metal paste is applied by screen printing. Then, the front-surface electrode 7 is formed by firing the first metal paste in a firing oven under conditions of the maximum temperature of 600° C. to 850° C. and a heating time of approximately from dozens of seconds to dozens of minutes, for example.

The second extracting electrode 8a included in the back-surface electrode 8 is prepared using a second metal paste including a metal powder containing silver as a main component, an organic vehicle, and a glass frit (also referred to as a silver paste), for example. As a method of applying the second metal paste to the semiconductor substrate 1, for example, screen printing or the like can be used. After the application of the second metal paste, the second metal paste may be dried by vaporizing a solvent in the second metal paste at a predetermined temperature. Then, the second extracting electrode 8a is formed on the second surface 1b side of the semiconductor substrate 1 by firing the second metal paste in a firing oven under conditions of the maximum temperature of 600° C. to 850° C. and a heating time of approximately from dozens of seconds to dozens of minutes.

The second collecting electrode 8b included in the back-surface electrode 8 is prepared using a third metal paste including a metal powder containing aluminum as a main component, an organic vehicle, and a glass fit (an Al paste), for example. First, the third metal paste is applied on the second surface 1b side of the semiconductor substrate 1 to be in contact with a portion of the second metal paste applied in advance. In the first embodiment, the third metal paste is applied onto the protective layer 6 formed on the passivation layer 4 on the second surface 1b and into the hole portion CH1. Here, the third metal paste may be applied to almost the entire surface of the second surface 1b side of the semiconductor substrate 1 except for a part of the portion at which the second extracting electrode 8a is formed. The application of the third metal paste can herein be realized by, for example, screen printing or the like. Here, after the application of the third metal paste, the third metal paste may be dried by vaporizing a solvent in the third metal paste at a predetermined temperature. The third metal paste is then fired, for example, in a firing oven under conditions of the maximum temperature of 600° C. to 850° C. and the heating time of approximately dozens of seconds to dozens of minutes to form the second collecting electrode 8b on the second surface 1b side of the semiconductor substrate 1. At this time, the third metal paste fires through the passivation layer 4 at the time of firing to be electrically connected to the first semiconductor layer 2. The second collecting electrode 8b is thereby formed. At this time, the third semiconductor layer 2bs is formed together with the second collecting electrode 8b. At this time, however, the third metal paste disposed on the protective layer 6 is blocked by the protective layer 6. Therefore, the passivation layer 4 blocked by the protective layer 6 has little adverse effect due to firing during firing of the third metal paste.

The back-surface electrode 8 can be formed as described above. Therefore, in the first embodiment, the second metal paste and the third metal paste are adopted as materials for electrode formation for forming the back-surface electrode 8. Here, for example, the second extracting electrode 8a may be formed after forming the second collecting electrode 8b. For example, the second extracting electrode 8a may come in direct contact with the semiconductor substrate 1, or may not come in direct contact with the semiconductor substrate 1 by a presence of the passivation layer 4 or the like between the second extracting electrode 8a and the semiconductor substrate 1. Further, the second extracting electrode 8a may be formed so as to be located on the protective layer 6. The front-surface electrode 7 and the back-surface electrode 8 may be formed by applying these metal pastes and then simultaneously firing. This can improve the productivity of the solar cell element 10. In addition, in this case, since heat history of the semiconductor substrate 1 is reduced, the output characteristics of the solar cell element 10 can be improved.

Through the above process, the protective layer 6 having a gradually increasing thickness from the inner edge portion IE1 of the hole portion CH1 to the periphery of the hole portion CH1 can be formed on the passivation layer 4 located on the semiconductor substrate 1. Also, the second collecting electrode 8b having a gradually decreasing thickness from the inner edge portion IE1 of the hole portion CH1 to the periphery of the hole portion CH1 can be formed on the protective layer 6 located on the passivation layer 4. Due to this, for example, when the second collecting electrode 8b is formed by firing the third metal paste, the amount of heat shrinkage can gradually change in the second collecting electrode 8b being fired between a region from inside the hole portion CH1 to above the hole portion CH1 and a region on the protective layer 6 in the vicinity of the hole portion CH1. As a result, distortion occurring in the second collecting electrode 8b in the vicinity of the inner edge portion IE1 of the hole portion CH1 is reduced, and cracks are less likely to occur in the second collecting electrode 8b. Therefore, the power generation efficiency of the solar cell element 10 can be improved by reducing the electric resistance of the back-surface electrode 8 including the second collecting electrode 8b.

1-7. Summary of First Embodiment

In the solar cell element 10 according to the first embodiment, for example, in the PERC structure, the thickness of the protective layer 6 gradually increases from the inner edge portion IE1 of the hole portion CH1 to the periphery of the hole portion CH1. Then, the thickness of the second collecting electrode 8b gradually decreases from the inner edge portion IE1 of the hole portion CH1 to the periphery of the hole portion CH1. Due to this, for example, when the second collecting electrode 8b is formed by firing the third metal paste, the amount of heat shrinkage can gradually change in the second collecting electrode 8b being fired between a region from inside the hole portion CH1 to above the hole portion CH1 and a region on the protective layer 6 in the vicinity of the hole portion CH1. As a result, distortion occurring in the second collecting electrode 8b in the vicinity of the inner edge portion IE1 of the hole portion CH1 is reduced, and cracks are less likely to occur in the second collecting electrode 8b. Even after the second collecting electrode 8b is formed, even if the thermal expansion coefficient differs approximately by one digit or more between the protective layer 6 and the second collecting electrode 8b, distortion occurring in the second collecting electrode 8b in response to a change in the operating temperature of the solar cell element 10 in the vicinity of the inner edge portion IE1 of the hole portion CH1 can be reduced. As a result, generation and development of cracks in the second collecting electrode 8b are less likely to occur. Therefore, the power generation efficiency of the solar cell element 10 can be improved by reducing the electric resistance of the back-surface electrode 8 including the second collecting electrode 8b.

Further, for example, in the hole portion CH1, the inner diameter of the protective layer 6 shows a tendency to increase as a distance from the semiconductor substrate 1 increases. For this reason, in the portion within the hole portion CH1 of the second collecting electrode 8b, the area of the cross section along the second surface 1b of the second collecting electrode 8b shows a tendency to increase as a distance from the semiconductor substrate 1 increases. Due to this, for example, in the portion in the hole portion CH1 of the second collecting electrode 8b, the electric resistance shows a tendency to decrease as a distance from the semiconductor substrate 1. As a result, for example, the function of collection and transmission of carriers by the second collecting electrode 8b can be improved.

Further, for example, the protective layer 6 is formed by applying the insulation paste. Therefore, unlike a case where the protective layer 6 is formed by the PECVD, the sputtering, or the like, a processing chamber, a vacuum pump, a laser, and the like can be unnecessary. This allows, for example, the apparatus required for manufacturing the solar cell element 10 to be reduced in size, simplified in configuration, and the like. Further, energy consumption in the manufacture of the solar cell element 10 can be reduced by omitting laser radiation for forming the hole portion CH1, for example.

Further, for example, as described above, the solar cell element 10 can be manufactured by performing the process of step ST1, step ST2, step ST3, and step ST4 in this order. Then, according to the manufacturing method of the insulation paste and the solar cell element 10 according to the first embodiment, the protective layer 6 is hardly fired through. As a result, the highly reliable solar cell element 10 can be provided.

2. Other Embodiments

The present disclosure is not limited to the above-described first embodiment, and various modifications and improvements are possible without departing from the scope of the present disclosure.

2-1. Second Embodiment

Figure 17:
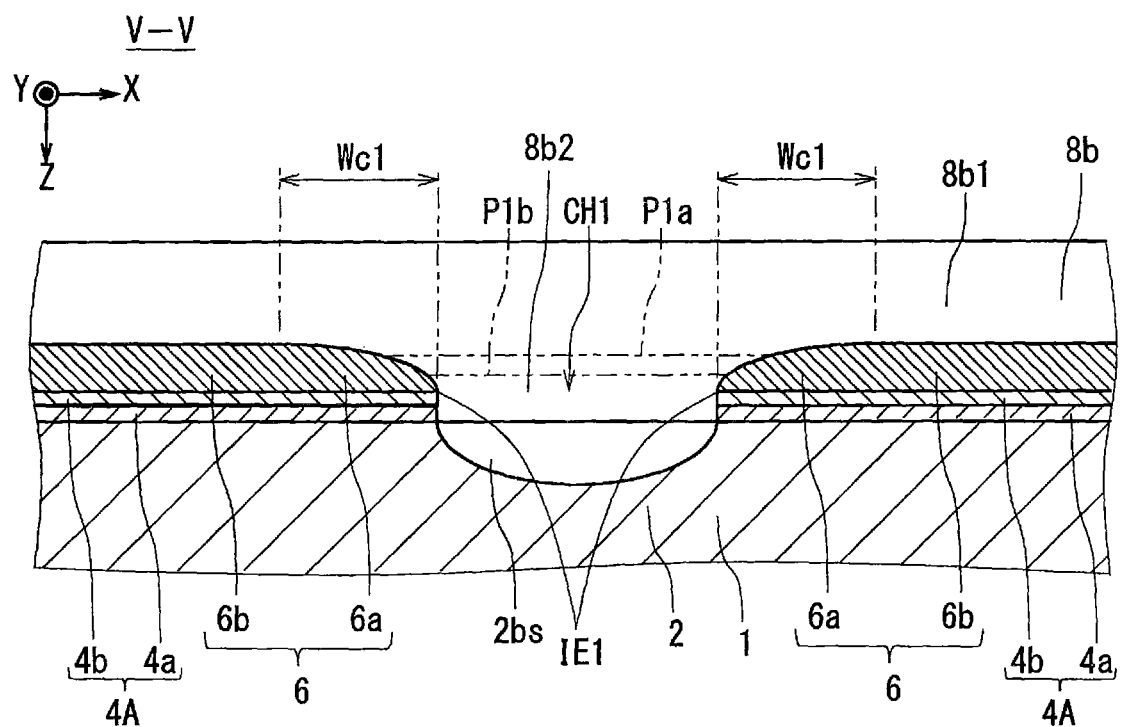
FIG. 17 illustrates a view showing an example of a part of a cross section corresponding to the cross section of FIG. 5 of the solar cell element according to the second embodiment.

In the first embodiment described above, for example, as shown in FIG. 17, a solar cell element 10A having a passivation layer 4A including a first passivation layer 4a and a second passivation layer 4b may be adopted as a replacement for the passivation layer 4. In the example of FIG. 17, the first passivation layer 4a is present in a position in contact with the semiconductor substrate 1, and the second passivation layer 4b is present in a position in contact with the protective layer 6. Here, another layer may be present between the first passivation layer 4a and the second passivation layer 4b, for example. In other words, the passivation layer 4A may be provided by stacking two or more passivation layers. Here, for example, adhesion between the passivation layer 4A and the protective layer 6 can be improved if the second passivation layer 4b in contact with the protective layer 6 contains the same main component as that of the protective layer 6. Here, for example, in a case where the main component of the protective layer 6 is silicon oxide, a case where the main component of the second passivation layer 4b is also silicon oxide ($SiO_2$ or the like) can be assumed. In this case, each of the first passivation layer 4a and the second passivation layer 4b can be formed to have a thickness of approximately several nm to 100 nm, for example, by the ALD, the PECVD, the sputtering, or the like.

2-2. Others

In each of the above embodiments, at least a part of the inner edge portion IE1 of the hole portion CH1 may have a concavo-convex shape in perspective plan view of the protective layer 6. Here, for example, when forming the protective layer 6, if the insulation paste is applied appropriately using a mask or the like, the concavo-convex shape can be selectively formed on a part of the inner edge portion IE1 of the hole portion CH1.

Further, in each of the embodiments, the protective layer 6 may be formed by a layer formation such as the sputtering or the CVD. In this case, for example, during formation of the protective layer 6 in the chamber, a gas containing chlorine may be introduced into the chamber. This allows the protective layer 6 to contain chlorine.

It is needless to mention that all or part of each of the above-described embodiments and the various modifications can be combined as appropriate in a range not inconsistent.

The invention claimed is:

1. A solar cell element comprising:
   a semiconductor substrate having a first surface and a second surface opposite the first surface;
   a passivation layer located on the second surface;
   a protective layer located on the passivation layer; and
   a back-surface electrode located on the protective layer, wherein
   the back-surface electrode is electrically connected to the semiconductor substrate via one or more hole portions penetrating the protective layer and the passivation layer, the protective layer includes a first region that increases in thickness as a distance from an inner edge portion of the hole portion increases toward a second region surrounding the first region, a distance between a position of the first region farthest from the inner edge portion and the inner edge portion is larger than a thickness in the second region, and the back-surface electrode decreases in thickness as a distance from the inner edge portion increases in a region of the back-surface electrode on the first region.

2. The solar cell element according to claim 1, wherein the inner edge portion includes a concavo-convex portion in perspective plan view of the protective layer.

3. The solar cell element according to claim 1, wherein the one or more hole portions include a first hole portion and a second hole portion adjacent to each other, and a distance between a position of the first region farthest from the inner edge portion and the inner edge portion located around the first hole portion is less than half of a distance between the first hole portion and the second hole portion.

4. The solar cell element according to claim 1, wherein the passivation layer includes a first passivation layer present in a position in contact with the semiconductor substrate and a second passivation layer present in a position in contact with the protective layer, and the second passivation layer and the protective layer contain a same main component.

5. The solar cell element according to claim 1, wherein the protective layer contains chlorine.

6. The solar cell element according to claim 5, wherein a portion located on a back-surface electrode side of the protective layer is higher in chlorine concentration than a portion located on a passivation layer side of the protective layer.

7. The solar cell element according to claim 5, wherein the passivation layer contains chlorine.

* * * * *